(12) United States Patent
Hebiguchi

(10) Patent No.: US 9,063,185 B2
(45) Date of Patent: Jun. 23, 2015

(54) CURRENT SENSOR

(71) Applicant: ALPS GREEN DEVICES CO., LTD., Tokyo (JP)

(72) Inventor: Hiroyuki Hebiguchi, Miyagi-ken (JP)

(73) Assignee: ALPS GREEN DEVICES CO., LTD., Tokyo (JP)

( * ) Notice: Subject to any disclaimer, the term of this patent is extended or adjusted under 35 U.S.C. 154(b) by 218 days.

(21) Appl. No.: 13/945,760

(22) Filed: Jul. 18, 2013

(65) Prior Publication Data

US 2013/0300404 A1    Nov. 14, 2013

Related U.S. Application Data

(63) Continuation of application No. PCT/JP2012/051849, filed on Jan. 27, 2012.

(30) Foreign Application Priority Data

Mar. 7, 2011    (JP) ................... 2011-048570

(51) Int. Cl.
*G01R 33/09* (2006.01)
*G01R 33/02* (2006.01)
*H01L 43/08* (2006.01)
*G01R 15/20* (2006.01)
*G01R 33/00* (2006.01)
*G01R 33/07* (2006.01)

(52) U.S. Cl.
CPC ............... *G01R 33/02* (2013.01); *H01L 43/08* (2013.01); *H01L 2924/30107* (2013.01); *G01R 15/205* (2013.01); *G01R 33/0005* (2013.01); *G01R 33/07* (2013.01)

(58) Field of Classification Search
CPC ..................... H01L 43/08; H01L 2924/30107
USPC ............... 324/244, 117 R, 117 H; 320/162
See application file for complete search history.

(56) References Cited

U.S. PATENT DOCUMENTS 8,487,612 B2 *   7/2013   Ichinohe et al. ............. 324/252
2009/0121704 A1   5/2009   Shibahara et al.
2013/0154631 A1 *   6/2013   Tamura ....................... 324/226

FOREIGN PATENT DOCUMENTS

JP    2001-305163    10/2001
JP    2009-162499    7/2009

OTHER PUBLICATIONS

Search Report dated Apr. 17, 2012 from International Application No. PCT/JP2012/051849.

* cited by examiner

*Primary Examiner* — Reena Aurora
(74) *Attorney, Agent, or Firm* — Beyer Law Group LLP

(57) ABSTRACT

A first magnetic sensor and a second magnetic sensor are disposed so that the main sensitivity axis direction of the first magnetic sensor is oriented in the direction of an induction magnetic field from a current flowing through a current line, the main sensitivity axis direction of the second magnetic sensor is oriented in a direction opposite to the direction of an induction magnetic field from the current flowing therethrough, the individual main sensitivity axis directions of the first and second magnetic sensors are oriented in a same direction, and the individual sub-sensitivity axis directions of the first and second magnetic sensors are oriented in the same directions as or directions opposite to the directions of the sub-sensitivity axis components of the induction magnetic fields to which the first and second magnetic sensors are individually subjected from a current flowing through an adjacent current line adjacent to the current line.

11 Claims, 12 Drawing Sheets

CURRENT SENSOR

CLAIM OF PRIORITY

This application is a Continuation of International Application No. PCT/JP2012/051849 filed on Jan. 27, 2012, which claims benefit of Japanese Patent Application No. 2011-048570 filed on Mar. 7, 2011. The entire contents of each application noted above are hereby incorporated by reference.

BACKGROUND OF THE INVENTION

1. Field of the Invention

The present invention relates to a current sensor measuring the magnitude of an electrical current. In particular, the present invention relates to a current sensor where the reduction of measurement accuracy, caused by an induction magnetic field due to an adjacent current, is suppressed.

2. Description of the Related Art

In a field such as a technology for driving motors in electric vehicles, hybrid cars, and the like, a relatively large current is handled. Therefore, for such use, a current sensor has been desired that is capable of measuring a large current in a non-contact manner. In addition, as such a current sensor, a type of current sensor has been put into practical use, the type of current sensor detecting the change of a magnetic field occurring from a current to be measured, using a magnetic sensor. Since, in a current sensor utilizing a magnetic sensor, the reduction of measurement accuracy due to the influence of a disturbance magnetic field becomes an issue, a method has been proposed that suppresses this.

As the method suppressing the reduction of measurement accuracy due to the influence of the disturbance magnetic field, for example, a method has been proposed that cancels out the influence of the disturbance magnetic field by providing a magneto impedance (MI) element in a direction opposite to a magnetic field occurring from a current to be detected. Such a technique has been disclosed in Japanese Unexamined Patent Application Publication No. 2001-305163.

SUMMARY OF THE INVENTION

As a magnetic sensor used for the above-mentioned current sensor, a giant magneto resistance (GMR) element, a Hall element, or the like is used, in addition to the MI element. When the GMR element or the like is used for the current sensor, in some cases it is difficult to sufficiently suppress the influence of a disturbance magnetic field even if the technique disclosed in Japanese Unexamined Patent Application Publication No. 2001-305163 is applied. In particular, when a current line other than a current line through which the current to be measured flows exists adjacent to the current sensor, in some cases current measurement accuracy is significantly reduced owing to the influence of a current flowing through that adjacent current line.

The present invention provides a current sensor reducing the influence of an induction magnetic field due to an adjacent current and suppressing the reduction of current measurement accuracy.

The present invention provides a current sensor including a first magnetic sensor and a second magnetic sensor that are disposed around a current line through which a current to be measured flows and detect an induction magnetic field from a current flowing through the current line, each of the first magnetic sensor and the second magnetic sensor including a sub-sensitivity axis in a direction perpendicular to a main sensitivity axis, wherein the first magnetic sensor and the second magnetic sensor are disposed so that a main sensitivity axis direction of the first magnetic sensor is oriented in a direction of an induction magnetic field from the current flowing through the current line, a main sensitivity axis direction of the second magnetic sensor is oriented in a direction opposite to a direction of an induction magnetic field from the current flowing through the current line, the individual main sensitivity axis directions of the first magnetic sensor and the second magnetic sensor are oriented in a same direction, and individual sub-sensitivity axis directions of the first magnetic sensor and the second magnetic sensors are the same directions as or directions opposite to directions of sub-sensitivity axis components of the induction magnetic fields to which the first magnetic sensor and the second magnetic sensor are individually subjected from a current flowing through an adjacent current line adjacent to the current line.

According to this configuration, since the influences of the induction magnetic field from the adjacent current on the sub-sensitivity axes of the first magnetic sensor and the second magnetic sensor emerge as outputs having polarities equal to each other, it may be possible to reduce the influences of the induction magnetic field from the adjacent current, which emerge in the sub-sensitivity axis directions, by obtaining a difference between the output of the first magnetic sensor and the output of the second magnetic sensor. Accordingly, it may be possible to suppress the reduction of current measurement accuracy.

The current sensor of the present invention may include an arithmetic device configured to obtain a difference between an output of the first magnetic sensor and an output of the second magnetic sensor.

In the current sensor of the present invention, the first magnetic sensor and the second magnetic sensor may also be disposed so that both of the individual sub-sensitivity axis directions of the first magnetic sensor and the second magnetic sensor are oriented in a same direction.

According to this configuration, by obtaining a difference between the output of the first magnetic sensor and the output of the second magnetic sensor, it may be possible to reduce the influence of a disturbance magnetic field (geomagnetism or the like) other than the induction magnetic field. Therefore, it may be possible to further suppress the reduction of current measurement accuracy.

The present invention provides a current sensor including a first magnetic sensor and a second magnetic sensor that are disposed around a current line through which a current to be measured flows and detect an induction magnetic field due to a current flowing through the current line, each of the first magnetic sensor and the second magnetic sensor including a sub-sensitivity axis in a direction perpendicular to a main sensitivity axis, wherein the first magnetic sensor and the second magnetic sensor are disposed so that both of individual main sensitivity axis directions of the first magnetic sensor and the second magnetic sensors are oriented in directions of induction magnetic fields from the current flowing through the current line or directions opposite to the directions of the induction magnetic fields, the individual main sensitivity axis directions of the first magnetic sensor and the second magnetic sensors are oriented in directions opposite to each other, a sub-sensitivity axis direction of the first magnetic sensor is equal to a direction of a sub-sensitivity axis component of the first magnetic sensor, the sub-sensitivity axis component being due to an induction magnetic field from a current flowing through an adjacent current line adjacent to the current line, and a sub-sensitivity axis direction of the second magnetic sensor is opposite to a direction of a sub-sensitivity axis component of the second magnetic sensor, the sub-sensitivity axis component being due to an induction magnetic field from the current flowing through the adjacent current line.

According to this configuration, since the influences of the induction magnetic field from the adjacent current on the sub-sensitivity axes of the first magnetic sensor and the second magnetic sensor emerge as outputs having polarities opposite to each other, it may be possible to reduce the influences of the induction magnetic field from the adjacent current, which emerge in the sub-sensitivity axis directions, by obtaining the sum of the output of the first magnetic sensor and the output of the second magnetic sensor. Accordingly, it may be possible to suppress the reduction of current measurement accuracy.

The current sensor of the present invention may also include an arithmetic device configured to obtain a sum of an output of the first magnetic sensor and an output of the second magnetic sensor.

In the current sensor of the present, the first magnetic sensor and the second magnetic sensor may also be disposed so that the individual sub-sensitivity axis directions of the first magnetic sensor and the second magnetic sensor are oriented in directions opposite to each other.

According to this configuration, by obtaining the sum of the output of the first magnetic sensor and the output of the second magnetic sensor, it may be possible to reduce the influence of a disturbance magnetic field (geomagnetism or the like) other than the induction magnetic field. Therefore, it may be possible to further suppress the reduction of current measurement accuracy.

In the current sensor of the present, the first magnetic sensor and the second magnetic sensor may also be disposed so that the main sensitivity axis direction of the first magnetic sensor is oriented in a direction of the adjacent current line or a direction opposite to the adjacent current line and the main sensitivity axis direction of the second magnetic sensor is oriented in the direction of the adjacent current line or the direction opposite to the adjacent current line.

According to this configuration, the main sensitivity axis component of the induction magnetic field from the adjacent current is decreased to the extent of not influencing current measurement. Therefore, it may be possible to sufficiently reduce the influence of the induction magnetic field from the adjacent current in the main sensitivity axis direction. Accordingly, it may be possible to further suppress the reduction of current measurement accuracy.

In the current sensor of the present invention, the main sensitivity axis direction of each of the first magnetic sensor and the second magnetic sensor may also be oriented in a direction in which the adjacent current line extends.

According to this configuration, since the main sensitivity axis direction of each of the first magnetic sensor and the second magnetic sensor turns out to be perpendicular to the direction of the induction magnetic field due to the adjacent current, the influence of the induction magnetic field due to the adjacent current does not emerge in the main sensitivity axis direction. Accordingly, it may be possible to remove the influence of the induction magnetic field from the adjacent current in the main sensitivity axis direction, and it may be possible to further suppress the reduction of current measurement accuracy.

In the current sensor of the present invention, the first magnetic sensor and the second magnetic sensor may also be disposed so that the individual main sensitivity axis directions of the first magnetic sensor and the second magnetic sensor are the same directions as or directions opposite to directions of main sensitivity axis components of the induction magnetic fields to which the first magnetic sensor and the second magnetic sensor are individually subjected from the current flowing through the adjacent current line.

According to this configuration, since the influences of the induction magnetic field from the adjacent current on the main sensitivity axes of the first magnetic sensor and the second magnetic sensor emerge as outputs having polarities equal to each other, it may be possible to reduce the influences of a disturbance magnetic field including the induction magnetic field from the adjacent current, which emerge in the main sensitivity axis directions, by obtaining a difference between the output of the first magnetic sensor and the output of the second magnetic sensor. Accordingly, it may be possible to further suppress the reduction of current measurement accuracy.

In the current sensor of the present invention, the first magnetic sensor and the second magnetic sensor may also be disposed so that the main sensitivity axis direction of the first magnetic sensor is equal to a direction of a main sensitivity axis component of the first magnetic sensor, the sub-sensitivity axis component being due to the induction magnetic field from the current flowing through the adjacent current line, and the main sensitivity axis direction of the second magnetic sensor is opposite to a direction of a main sensitivity axis component of the second magnetic sensor, the main sensitivity axis component being due to an induction magnetic field from the current flowing through the adjacent current line.

According to this configuration, since the influences of the induction magnetic field from the adjacent current on the main sensitivity axes of the first magnetic sensor and the second magnetic sensor emerge as outputs having polarities opposite to each other, it may be possible to reduce the influences of a disturbance magnetic field including the induction magnetic field from the adjacent current, which emerge in the main sensitivity axis directions, by obtaining the sum of the output of the first magnetic sensor and the output of the second magnetic sensor. Accordingly, it may be possible to further suppress the reduction of current measurement accuracy.

The current sensor of the present invention may also further include a circuit substrate in which the first magnetic sensor and the second magnetic sensor are mounted, the circuit substrate being disposed within one plane perpendicular to a direction in which the current line extends.

DESCRIPTION OF THE PREFERRED EMBODIMENTS

The present inventor found out that, in a current sensor utilizing a magnetic sensor including a GMR element or the like, the main cause of not being capable of sufficiently suppressing the influence of an induction magnetic field due to an adjacent current is to have a sensitivity in a direction perpendicular to a sensitivity axis. For example, in a magnetic sensor utilizing a GMR element, in some cases, a sensitivity in a direction perpendicular to a sensitivity axis becomes about several dozen percent of a sensitivity in the sensitivity axis direction. In this way, when the magnetic sensor also having the sensitivity in a direction perpendicular to the sensitivity axis is used, even if the direction of the sensitivity axis (hereinafter, referred to as a main sensitivity axis direction) is simply oriented in the direction of the induction magnetic field, it is difficult to sufficiently remove the influence of the induction magnetic field from the adjacent current by only obtaining a difference between outputs. The reason is that, by only controlling the main sensitivity axis direction, it is difficult to cancel out the influence of the induction magnetic field from the adjacent current, which emerges in a direction perpendicular to the main sensitivity axis direction (hereinafter, referred to as a sub-sensitivity axis direction).

Figure 1:
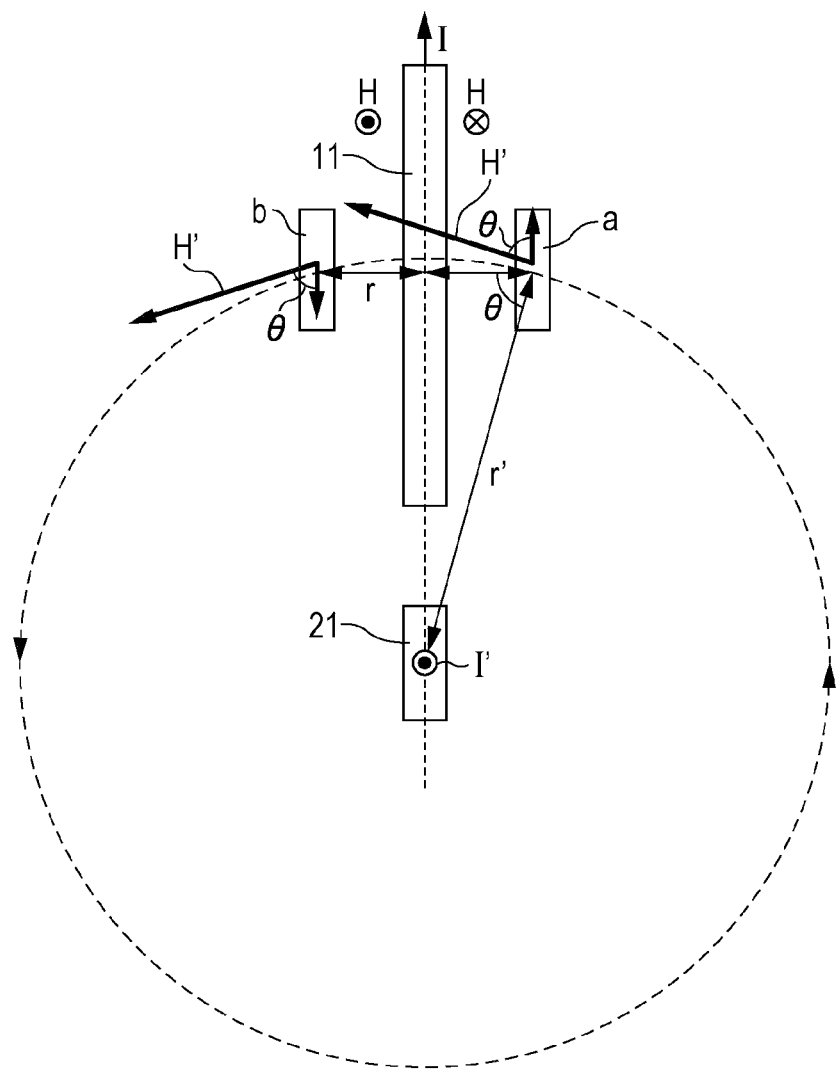
FIG. 1 is a model diagram for calculating an influence of an induction magnetic field from an adjacent current on measurement accuracy of a current sensor, the induction magnetic field emerging in a sub-sensitivity axis direction.

Here, with reference to FIG. 1, the influence of an induction magnetic field from an adjacent current on the measurement accuracy of a current sensor will be considered. FIG. 1 is a model diagram for calculating the influence of an induction magnetic field from an adjacent current on the measurement accuracy of a current sensor, the induction magnetic field emerging in a sub-sensitivity axis direction. In FIG. 1, a current sensor is illustrated that has a configuration where two magnetic sensors a and b are disposed around a current line 11 extending from the lower side of the plane of paper to the upper side thereof. In addition, an adjacent current line 21 is disposed adjacent to the current sensor. A current to be measured I flows through the current line 11 so as to be headed from the lower side of the plane of paper to the upper side thereof. An adjacent current I' flows through the adjacent current line 21 so as to be headed from the far side of the plane of paper to the near side of the plane of paper.

In the above-mentioned current sensor, it is assumed that the main sensitivity axis direction is a direction perpendicular to the plane of paper. In addition, it is assumed that the sub-sensitivity axis direction of the magnetic sensor a is headed to the upper side of the plane of paper and the sub-sensitivity axis direction of the magnetic sensor b is headed to the lower side of the plane of paper. Hereinafter, an influence in a sub-sensitivity axis direction will be only taken into consideration.

When it is assumed that distances between the central axis of the adjacent current line 21 and the centers of the magnetic sensors a and b are r' and the adjacent current line 21 has an infinite length (in other words, the length of the adjacent current I' is infinite), magnetizing fields H' due to the adjacent current I' at the positions of the magnetic sensors a and b are expressed as $H'=I'/2\pi r'$. When it is assumed that an angle between the sub-sensitivity axis direction and the magnetizing field H' due to the adjacent current I is $\theta$, the sub-sensitivity axis direction component $H'_s$ of the magnetizing field H' becomes $H'_s = H' \cos \theta$. In a case where it is assumed that distances between the central axis of the current line 11 and the centers of the magnetic sensors a and b are r, since the $\cos \theta = r/r'$ is satisfied, $H'_s = H' \cos \theta = I'r/2\pi r'^2$ becomes satisfied.

Since the magnetizing fields H due to the current to be measured I at the positions of the magnetic sensors a and b are $H = I/2\pi r$ in the same way, if the sensitivity of the sub-sensitivity axis is 10 percent with respect to the sensitivity of the main sensitivity axis, the influence X of the adjacent current I' at a sensor output becomes $X = 0.1 \times H'_s/H = 0.1 \times (I'r/2\pi r'^2)/(I/2\pi r) = 0.1 \times (I'/I)(r/r')^2$. For example, a state where the current to be measured I is small compared with the adjacent current I' is simulated, and it is assumed that $I'/I = 100$ is approximately satisfied. In addition, the constraint of disposition or the like is envisioned, and it is assumed that $r/r' = 0.1$ is approximately satisfied. In this case, $X=0.1$, namely, 10 percent, is satisfied. Usually, since it is desired that the measurement error of a current sensor is 5 percent or less, and in some situations, 1 percent or less, a countermeasure may become necessary in the above-mentioned case.

On the basis of such a finding, the present inventor conceived the idea of cancelling out the influence of a disturbance magnetic field emerging in the sub-sensitivity axis direction, in particular, an induction magnetic field due to the adjacent current, by controlling the directions of the sub-sensitivity axes of two magnetic sensors. In other words, the outline of the present invention is that, in a type of current sensor in which, by subjecting the outputs of the two magnetic sensors to an arithmetic operation (a difference or a sum), the influence of a disturbance magnetic field is removed, a configuration (in the case of a difference) where the individual sub-sensitivity axis directions of the two magnetic sensors are oriented in the same directions as or directions opposite to the directions of the sub-sensitivity axis components of an induction magnetic field to which the two magnetic sensors are individually subjected from a current flowing through an adjacent current line or a configuration (in the case of a sum) where the sub-sensitivity axis direction of one of the two magnetic sensors is oriented in the same direction as the direction of the sub-sensitivity axis component of an induction magnetic field from the current flowing through the adjacent current line and the sub-sensitivity axis direction of the other of the two magnetic sensors is oriented in a direction opposite to the direction of the sub-sensitivity axis component of an induction magnetic field from the current flowing through the adjacent current line is adopted and hence, the influence of the induction magnetic field due to the adjacent current is reduced and the reduction of current measurement accuracy is suppressed. Hereinafter, embodiments of the present invention will be described in detail with reference to drawings.

First Embodiment

Figure 2A:
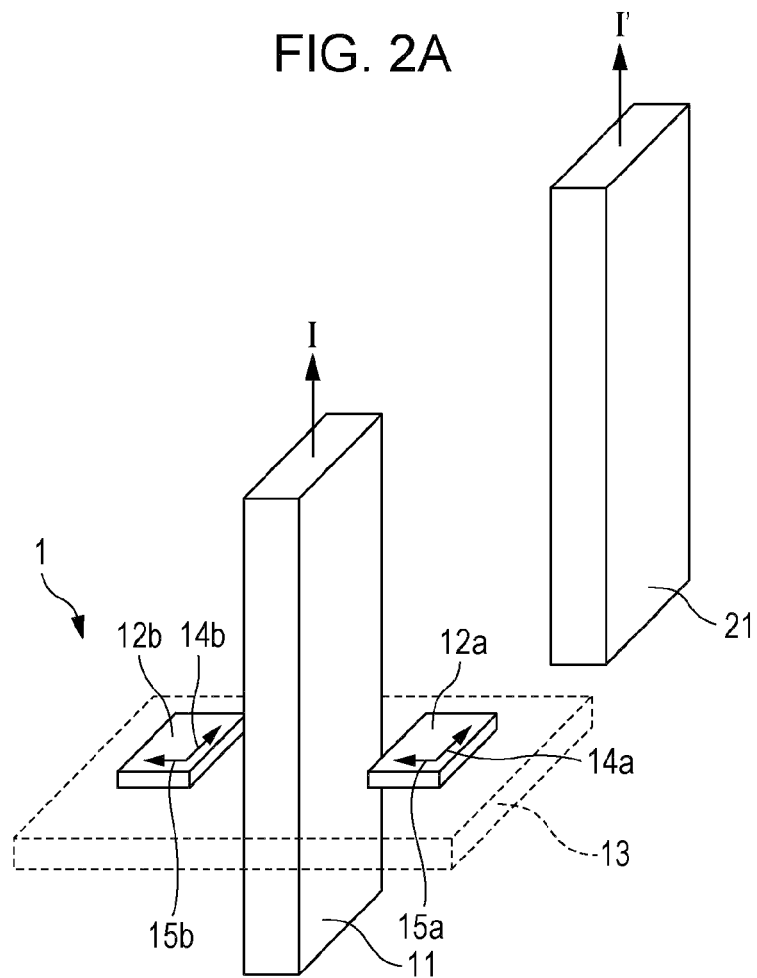
FIGS. 2A and 2B are pattern diagrams illustrating an example of a configuration of a current sensor according to a first embodiment.
Figure 2B:
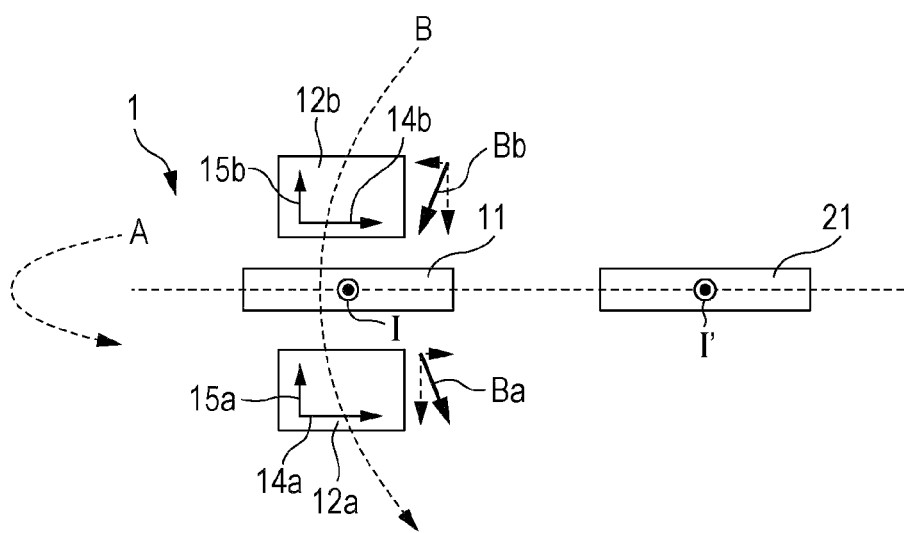

FIGS. 2A and 2B are pattern diagrams illustrating a current sensor 1 of the present embodiment. FIG. 2A is a perspective view schematically illustrating the current sensor 1 and the surrounding configuration thereof, and FIG. 2B is a plan view where the current sensor 1 is viewed from the upper direction (the upper side) in the plane of paper in FIG. 2A. Hereinafter, in the perspective view, the lower left direction in the plane of paper is referred to as a near side, the upper right direction in the plane of paper is referred to as a far side, the left direction in the plane of paper is referred to as a left side, the right direction in the plane of paper is referred to as a right side, the upper direction in the plane of paper is referred to as an upper side, and the lower direction in the plane of paper is referred to as a lower side.

In FIG. 2A, solid arrows assigned to a current line 11 and an adjacent current line 21 indicate the directions of current flowing therethrough. In other words, in FIGS. 2A and 2B, a current to be measured I in the current line 11 and an adjacent current I' in the adjacent current line 21 flow in directions parallel to each other. In addition, in FIGS. 2A and 2B, long solid arrows 14a and 14b and short arrows 15a and 15b assigned to a first magnetic sensor 12a and a second magnetic sensor 12b individually indicate the directions of main sensitivity axes and the directions of sub-sensitivity axes. Here, the "main sensitivity axis" means an axis oriented in a direction where the sensitivity of a magnetic sensor becomes a maximum, and the "sub-sensitivity axis" means an axis oriented in a direction having a maximum sensitivity, from among directions perpendicular to the main sensitivity axis.

As illustrated in FIGS. 2A and 2B, the current sensor 1 includes the first magnetic sensor 12a and the second magnetic sensor 12b, disposed around the current line 11 through which the current to be measured I flows. The first magnetic sensor 12a and the second magnetic sensor 12b are disposed so that distances from the current line 11 become approximately equal to each other. The current line 11 extends in a predetermined direction (in FIG. 2A, in a vertical direction). If being a configuration element capable of conducting the current to be measured I, the current line 11 may also have any type of embodiment. For example, examples of the current line 11 include conductive members such as a plate-like conductive member and a thin film-like conductive member (conductive pattern), whose shapes are not the form of a line. In addition, the current line 11 is treated as an element not serving as the configuration element of the current sensor 1.

In addition to the first magnetic sensor 12a and the second magnetic sensor 12b, the current sensor 1 includes a circuit substrate 13 in which the first magnetic sensor 12a and the second magnetic sensor 12b are mounted and which is disposed within one plane perpendicular to the direction in which the current line 11 extends. In addition, the current sensor 1 includes an arithmetic device 16 (FIG. 3) subjecting the output of the first magnetic sensor 12a and the output of the second magnetic sensor 12b to an arithmetic operation.

If being magnetic sensors capable of performing magnetic detection and having sub-sensitivity axes in directions perpendicular to main sensitivity axes, the first magnetic sensor 12a and the second magnetic sensor 12b are not specifically limited. For example, a magnetic sensor utilizing a magnetoresistance effect element such as a giant magneto resistance (GMR) element or a tunnel magneto resistance (TMR) element, a magnetic sensor utilizing a Hall element, or the like may be applied.

In the current sensor 1 illustrated in FIGS. 2A and 2B, the first magnetic sensor 12a and the second magnetic sensor 12b are disposed around the current line 11 so that outputs whose phases are substantially opposite to each other are obtained owing to an induction magnetic field A from the current to be measured I flowing through the current line 11. In FIGS. 2A and 2B, the current line 11 is disposed so as to be sandwiched between the first magnetic sensor 12a and the second magnetic sensor 12b, and the main sensitivity axis directions (the arrows 14a and 14b) of the first magnetic sensor 12a and the second magnetic sensor 12b are disposed so as to be oriented in directions perpendicular to the direction in which the current line 11 extends. More specifically, the main sensitivity axis direction (the arrow 14a) of the first magnetic sensor 12a is disposed so as to be oriented in the direction of the induction magnetic field A from the current to be measured I flowing through the current line 11, the main sensitivity axis direction (the arrow 14b) of the second magnetic sensor 12b is disposed so as to be oriented in a direction opposite to the direction of the induction magnetic field A from the current to be measured I flowing through the current line 11, and the individual main sensitivity axis directions of the first magnetic sensor 12a and the second magnetic sensor 12b are disposed so as to be oriented in the same direction. In addition, in a relationship with an induction magnetic field B from the adjacent current I' flowing through the adjacent current line 21, the sub-sensitivity axis direction (the arrow 15a (headed to the upper side of the plane of paper in FIG. 2B)) of the first magnetic sensor 12a is disposed so as to be opposite to the direction (headed to the lower side of the plane of paper in FIG. 2B) of the sub-sensitivity axis component of an induction magnetic field Ba to which the first magnetic sensor 12a is subjected, and the sub-sensitivity axis direction (the arrow 15b (headed to the upper side of the plane of paper in FIG. 2B)) of the second magnetic sensor 12b is disposed so as to be opposite to the direction (headed to the lower side of the plane of paper in FIG. 2B) of the sub-sensitivity axis component of an induction magnetic field Bb to which the second magnetic sensor 12b is subjected. In other words, the individual sub-sensitivity axis directions (the arrows 15a and 15b) of the first magnetic sensor 12a and the second magnetic sensor 12b are disposed so as to be oriented in directions opposite to the directions of the sub-sensitivity axis components of the induction magnetic field B to which the first magnetic sensor 12a and the second magnetic sensor 12b are individually subjected from the adjacent current I'.

In the current sensor 1 illustrated in FIGS. 2A and 2B, since the main sensitivity axis direction of one of the first magnetic sensor 12a and the second magnetic sensor 12b is oriented in the direction of the induction magnetic field A, and the main sensitivity axis direction of the other is oriented in a direction opposite to the induction magnetic field A, the influence of the induction magnetic field A emerges as the output signals of the first magnetic sensor 12a and the second magnetic sensor 12b, whose phases are substantially opposite to each other. In addition, since the individual main sensitivity axis directions of the first magnetic sensor 12a and the second magnetic sensor 12b are oriented in the same direction, the influences of a disturbance magnetic field equally emerge in the output of the first magnetic sensor 12a and the output of the second magnetic sensor 12b. In addition, since the sub-sensitivity axis direction of one magnetic sensor is opposite to the direction of the sub-sensitivity axis component of the induction magnetic field B, and the sub-sensitivity axis direction of the other magnetic sensor is also opposite to the direction of the sub-sensitivity axis component of the induction magnetic field B, the influences of the induction magnetic field B due to the adjacent current I' emerge whose polarities are equal to each other, in the output of the first magnetic sensor 12a and the output of the second magnetic sensor 12b. Therefore, by obtaining a difference between the output of the first magnetic sensor 12a and the output of the second magnetic sensor 12b, it may be possible to reduce the influence of a disturbance magnetic field including the induction magnetic field B and suppress the reduction of current measurement accuracy. In addition, the output signals whose phases are substantially opposite to each other mean output signals in an inversion relationship, aside from a noise component and the like. In this regard, however, since it may be only necessary for the output signals to be in a relationship sufficient for conducting current measurement with a desired degree of accuracy, it is not requested that the output signals have values whose plus and minus are exactly inverted. In addition, the equal polarity means that the plus and minus of the outputs coincide with each other.

In addition, in the current sensor 1 illustrated in FIGS. 2A and 2B, the main sensitivity axis direction (the arrow 14a) of the first magnetic sensor 12a is oriented in the direction of the adjacent current line 21, and the main sensitivity axis direction (the arrow 14b) of the second magnetic sensor 12b is oriented in the direction of the adjacent current line 21. Accordingly, it may be possible to decrease the main sensitivity axis component of the first magnetic sensor 12a and the main sensitivity axis component of the second magnetic sensor, which are due to the induction magnetic field B, to the extent of not influencing current measurement. Therefore, it may be possible to sufficiently reduce the influence of the induction magnetic field B from the adjacent current I' in the main sensitivity axis direction and further suppress the reduction of current measurement accuracy.

In addition, in the current sensor 1 illustrated in FIGS. 2A and 2B, both of the individual sub-sensitivity axis directions (the arrows 15a and 15b) of the first magnetic sensor 12a and the second magnetic sensor 12b are disposed as as to be oriented in the same direction. In this case, by obtaining a difference between the output of the first magnetic sensor 12a and the output of the second magnetic sensor 12b, it may be possible to reduce the influence of a disturbance magnetic field (geomagnetism or the like) other than the induction magnetic field B. Therefore, it may be possible to further suppress the reduction of current measurement accuracy.

Figure 3:
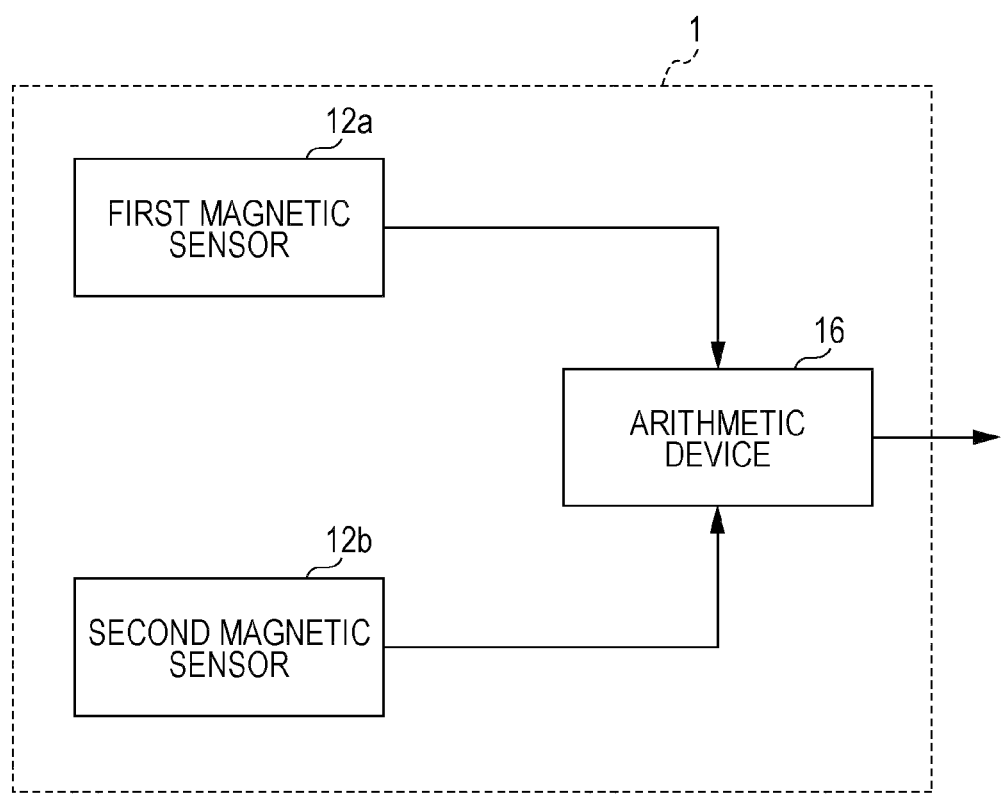
FIG. 3 is a block diagram illustrating an example of a circuit configuration of the current sensor according to the first embodiment.

FIG. 3 is a block diagram according to the circuit configuration of the current sensor 1. As illustrated in FIG. 3, the current sensor 1 includes the arithmetic device 16 connected to the output terminals of the first magnetic sensor 12a and the second magnetic sensor 12b. Here, the arithmetic device 16 has a function for calculating a difference between the output of the first magnetic sensor 12a and the output of the second magnetic sensor 12b. Therefore, when a current has flowed through the current line 11, the induction magnetic field A has occurred around the current line 11, and output signals corresponding to the induction magnetic field A have been output from the first magnetic sensor 12a and the second magnetic sensor 12b, it may be possible for the arithmetic device 16, which has received the output signals, to calculate and output a difference between the corresponding two output signals. By obtaining a difference between the two output signals in this way, it may be possible to cancel out the influence of a disturbance magnetic field and enhance the measurement accuracy of a current. In addition, the function of the arithmetic device 16 may be realized using hardware or may also be realized using software.

Figure 4A:
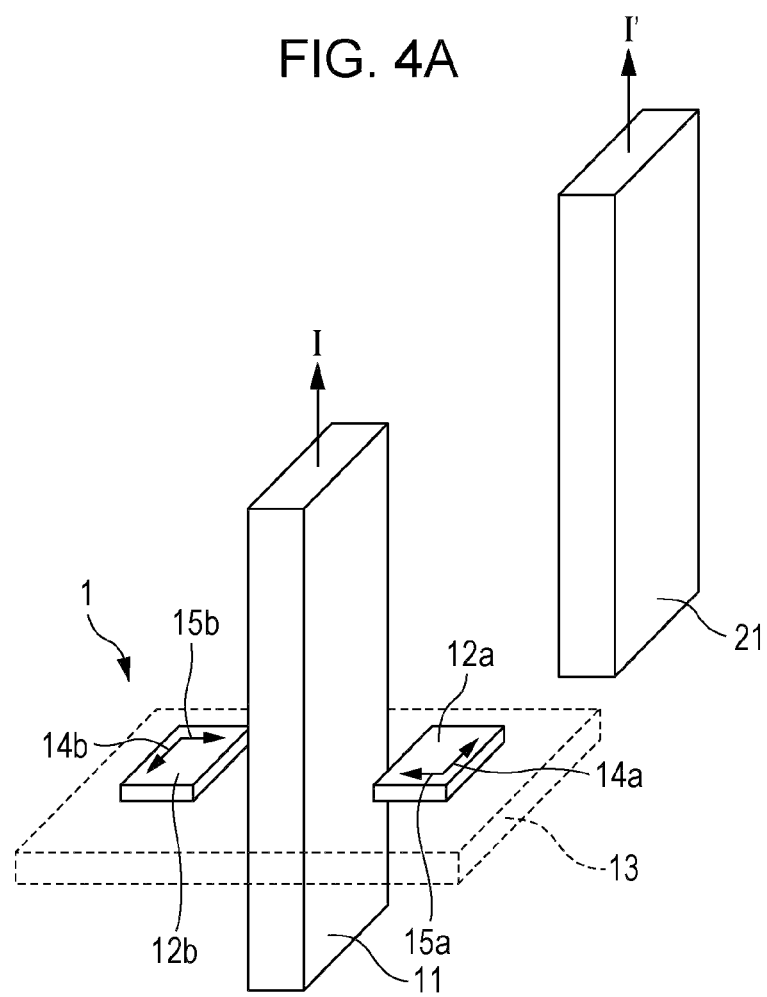
FIGS. 4A and 4B are pattern diagrams illustrating an example of a modification to the current sensor according to the first embodiment.
Figure 4B:
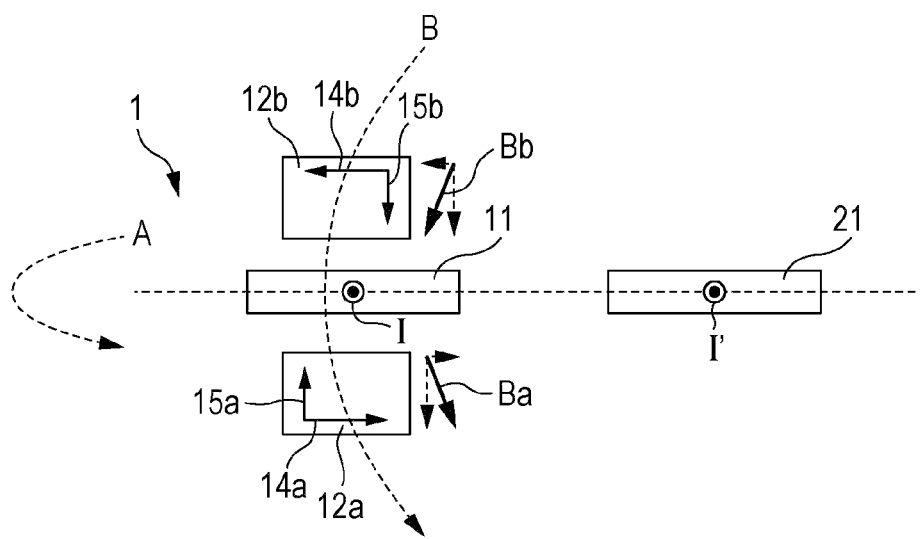

FIGS. 4A and 4B are pattern diagrams illustrating a current sensor 1 according to an example of a modification to the present embodiment. FIG. 4A is a perspective view schematically illustrating the current sensor 1 and the surrounding configuration thereof, and FIG. 4B is a plan view where the current sensor 1 is viewed from the upper direction (the upper side) in the plane of paper in FIG. 4A.

The basic configuration of the current sensor 1 illustrated in FIGS. 4A and 4B is the same as the current sensor 1 illustrated in FIGS. 2A and 2B. In other words, the current sensor 1 illustrated in FIGS. 4A and 4B includes the first magnetic sensor 12a, the second magnetic sensor 12b, the circuit substrate 13, the arithmetic device, and the like.

In the current sensor 1 illustrated in FIGS. 4A and 4B, the first magnetic sensor 12a and the second magnetic sensor 12b are disposed around the current line 11 so that outputs whose phases are substantially equal to each other are obtained owing to the induction magnetic field A from the current to be measured I flowing through the current line 11. In FIGS. 4A and 4B, the current line 11 is disposed so as to be sandwiched between the first magnetic sensor 12a and the second magnetic sensor 12b, and the main sensitivity axis directions (the arrows 14a and 14b) of the first magnetic sensor 12a and the second magnetic sensor 12b are disposed so as to be oriented in directions perpendicular to the direction in which the current line 11 extends. More specifically, the main sensitivity axis direction (the arrow 14a) of the first magnetic sensor 12a is disposed so as to be oriented in the direction of the induction magnetic field A from the current to be measured I flowing through the current line 11, the main sensitivity axis direction (the arrow 14b) of the second magnetic sensor 12b is disposed so as to be oriented in the direction of the induction magnetic field A from the current to be measured I flowing through the current line 11, and the individual main sensitivity axis directions of the first magnetic sensor 12a and the second magnetic sensor 12b are disposed so as to be oriented in directions opposite to each other. In addition, in a relationship with the induction magnetic field B from the adjacent current I' flowing through the adjacent current line 21, the sub-sensitivity axis direction (the arrow 15a (headed to the upper side of the plane of paper in FIG. 4B)) of the first magnetic sensor 12a is disposed so as to be opposite to the direction (headed to the lower side of the plane of paper in FIG. 4B) of the sub-sensitivity axis component of an induction magnetic field Ba to which the first magnetic sensor 12a is subjected, and the sub-sensitivity axis direction (the arrow 15b (headed to the lower side of the plane of paper in FIG. 4B)) of the second magnetic sensor 12b is disposed so as to be equal to the direction (headed to the lower side of the plane of paper in FIG. 4B) of the sub-sensitivity axis component of an induction magnetic field Bb to which the second magnetic sensor 12b is subjected.

In the current sensor 1 illustrated in FIGS. 4A and 4B, since both of the individual main sensitivity axis directions of the first magnetic sensor 12a and the second magnetic sensor 12b are oriented in the direction of the induction magnetic field A, the influence of the induction magnetic field A emerges as the output signals of the first magnetic sensor 12a and the second magnetic sensor 12b, whose phases are substantially equal to each other. In addition, since the individual main sensitivity axis directions of the first magnetic sensor 12a and the second magnetic sensor 12b are oriented in directions opposite to each other, the influences of the disturbance magnetic field reversely emerge in the output of the first magnetic sensor 12a and the output of the second magnetic sensor 12b. In addition, since the sub-sensitivity axis direction of one magnetic sensor is equal to the direction of the sub-sensitivity axis component of the induction magnetic field B, and the sub-sensitivity axis direction of the other magnetic sensor is opposite to the direction of the sub-sensitivity axis component of the induction magnetic field B, the influences of the induction magnetic field B due to the adjacent current I' emerge whose polarities are opposite to each other, in the output of the first magnetic sensor 12a and the output of the second magnetic sensor 12b.

Therefore, by obtaining the sum of the output of the first magnetic sensor 12a and the output of the second magnetic sensor 12b, it may be possible to reduce the influence of a disturbance magnetic field including the induction magnetic field B and suppress the reduction of current measurement accuracy. In addition, the output signals whose phases are substantially equal to each other mean output signals equal to each other, aside from a noise component and the like. In this regard, however, since it may be only necessary for the output signals to be in a relationship sufficient for conducting current measurement with a desired degree of accuracy, it is not requested that the output signals have exactly the same value. In addition, the opposite polarity means that the plus and minus of the outputs are in a reverse relationship. In addition, in the current sensor 1 illustrated in FIGS. 4A and 4B, the arithmetic device 16 has a function for calculating the sum of the output of the first magnetic sensor 12a and the output of the second magnetic sensor 12b.

In addition, in the current sensor 1 illustrated in FIGS. 4A and 4B, the main sensitivity axis direction (the arrow 14a) of the first magnetic sensor 12a is oriented in the direction of the adjacent current line 21, and the main sensitivity axis direction (the arrow 14b) of the second magnetic sensor 12b is oriented in a direction opposite to the adjacent current line 21. Accordingly, it may be possible to decrease the main sensitivity axis component of the first magnetic sensor 12a and the main sensitivity axis component of the second magnetic sensor, which are due to the induction magnetic field B, to the extent of not influencing current measurement. Therefore, it may be possible to sufficiently reduce the influence of the induction magnetic field B from the adjacent current I' in the main sensitivity axis direction and further suppress the reduction of current measurement accuracy.

In addition, in the current sensor 1 illustrated in FIGS. 4A and 4B, both of the individual sub-sensitivity axis directions (the arrows 15a and 15b) of the first magnetic sensor 12a and the second magnetic sensor 12b are disposed as as to be oriented in directions opposite to each other. In this case, by obtaining the sum of the output of the first magnetic sensor 12a and the output of the second magnetic sensor 12b, it may be possible to reduce the influence of a disturbance magnetic field (geomagnetism or the like) other than the induction magnetic field B. Therefore, it may be possible to further suppress the reduction of current measurement accuracy.

Figure 5A:
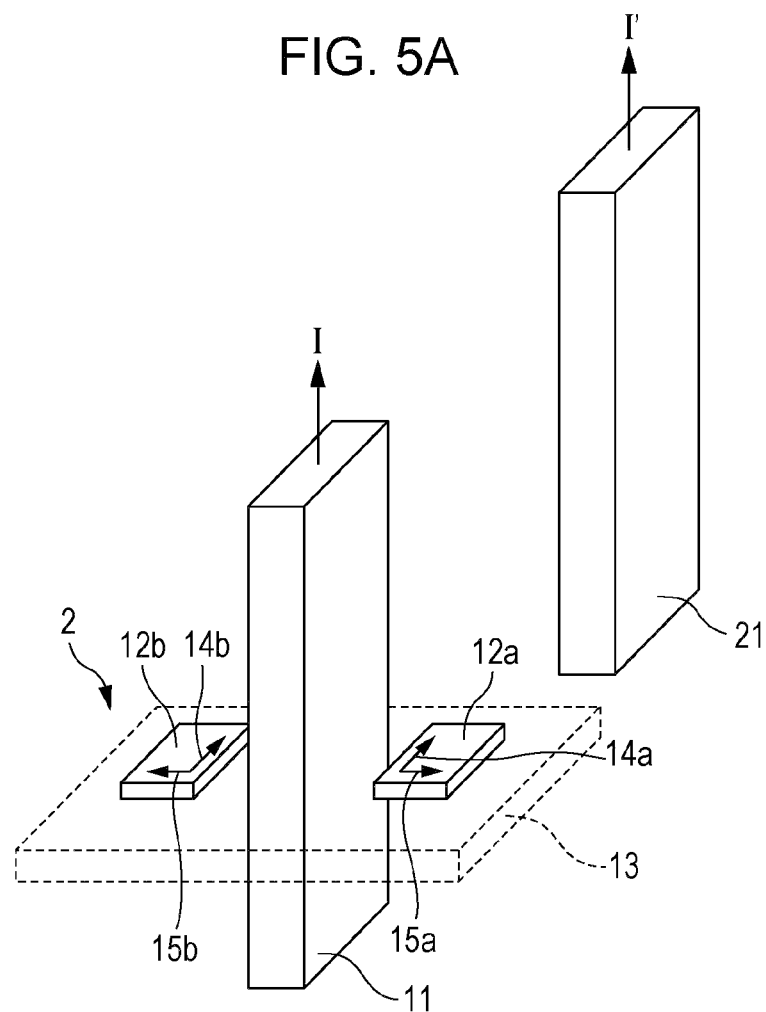
FIGS. 5A and 5B are pattern diagrams illustrating an example of a configuration of a current sensor.
Figure 5B:
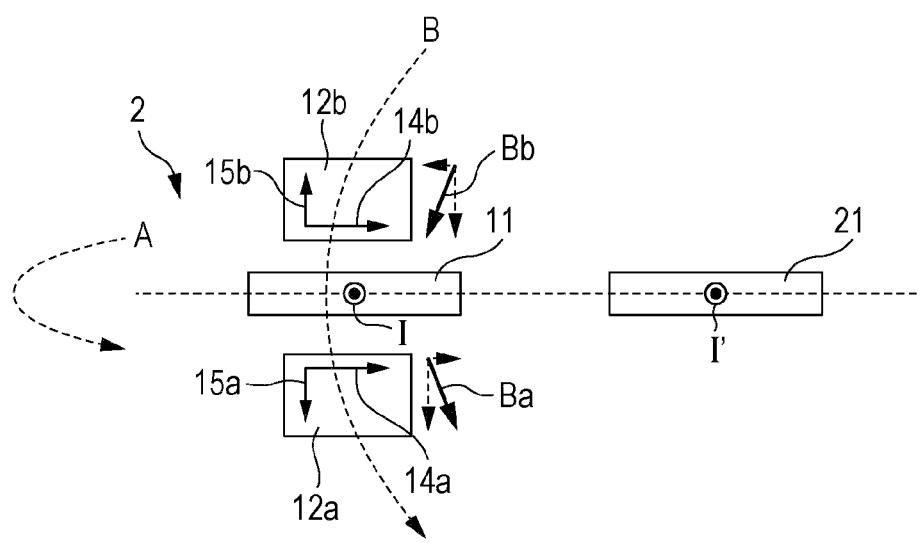

As described above, for example, compared with a current sensor 2 illustrated in FIGS. 5A and 5B, it may be possible for the current sensor 1 according to the present embodiment to reduce the influence of the induction magnetic field B and suppress the reduction of current measurement accuracy. The reason is that, in the current sensor 1 according to the present embodiment, the first magnetic sensor 12a and the second magnetic sensor 12b are disposed so that it may be possible to adequately cancel out the influence of the induction magnetic field B in the sub-sensitivity axis direction. In addition, since it may be possible for the current sensor 1 according to the present embodiment to reduce the influence of the induction magnetic field B, it may be possible to narrow a distance between the current line 11 and the adjacent current line 21. Therefore, it may be possible to achieve the miniaturization of a system including the current sensor 1 and saving of the space thereof.

In addition, in FIGS. 2A and 2B, the main sensitivity axis direction of the first magnetic sensor 12a may also be oriented in a direction opposite to the direction of the induction magnetic field A, and the main sensitivity axis direction of the second magnetic sensor 12b may also be oriented in the direction of the induction magnetic field A. In addition, the sub-sensitivity axis direction of the first magnetic sensor 12a may also be equal to the direction of the sub-sensitivity axis component of the induction magnetic field Ba to which the first magnetic sensor 12a is subjected, and the sub-sensitivity axis direction of the second magnetic sensor 12b may also be equal to the direction of the sub-sensitivity axis component of the induction magnetic field Bb to which the second magnetic sensor 12b is subjected. In other words, the individual sub-sensitivity axis directions of the first magnetic sensor 12a and the second magnetic sensor 12b may also be equal to the directions of the sub-sensitivity axis components of the induction magnetic field B to which the first magnetic sensor 12a and the second magnetic sensor 12b are individually subjected.

In addition, in FIGS. 4A and 4B, both of the main sensitivity axis directions of the first magnetic sensor 12a and the second magnetic sensor 12b may also be oriented in directions opposite to the direction of the induction magnetic field A. In addition, the sub-sensitivity axis direction of the first magnetic sensor 12a may also be equal to the direction of the sub-sensitivity axis component of the induction magnetic field Ba to which the first magnetic sensor 12a is subjected, and the sub-sensitivity axis direction of the second magnetic sensor 12b may also be opposite to the direction of the sub-sensitivity axis component of the induction magnetic field Bb to which the second magnetic sensor 12b is subjected.

In addition to this, the present embodiment may be arbitrarily combined with a configuration illustrated in another embodiment, and implemented.

Second Embodiment

Figure 6A:
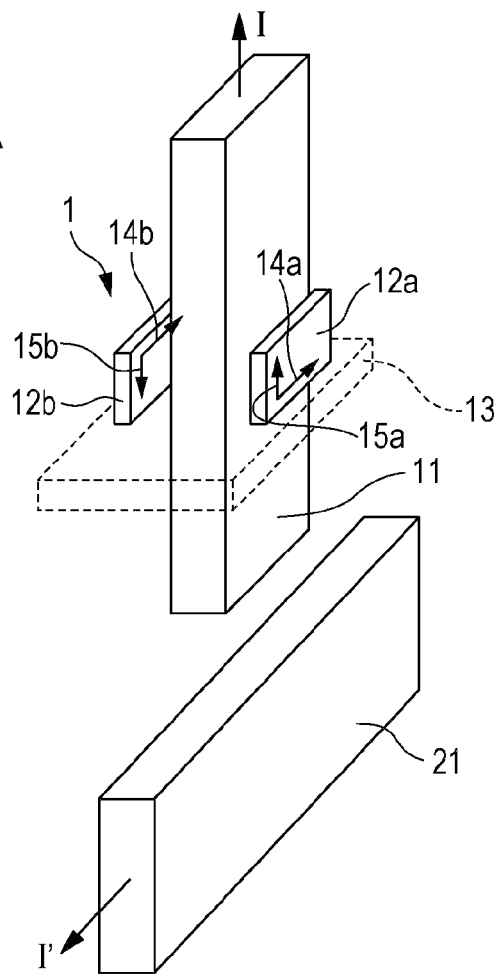
FIGS. 6A and 6B are pattern diagrams illustrating an example of a configuration of a current sensor according to a second embodiment.
Figure 6B:
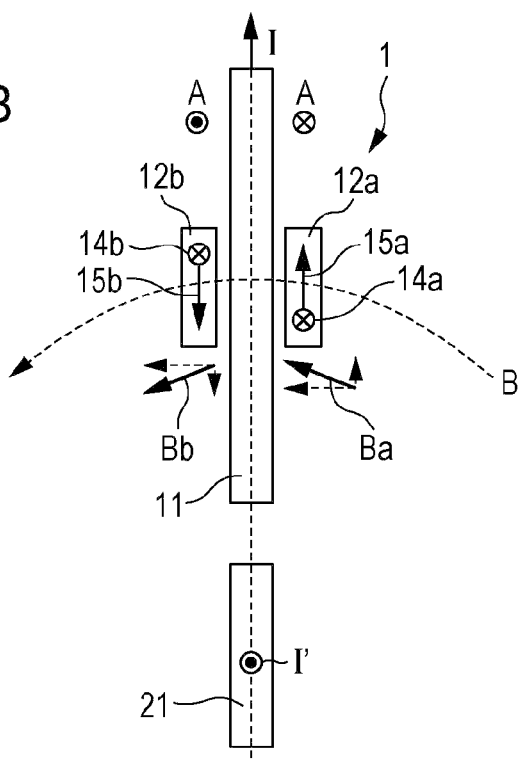

In the present embodiment, an example of another configuration of the current sensor 1 of the present invention will be described. FIGS. 6A and 6B are pattern diagrams illustrating the current sensor 1 of the present embodiment. FIG. 6A is a perspective view schematically illustrating the current sensor 1 and the surrounding configuration thereof, and FIG. 6B is a plan view where the current sensor 1 is viewed from the lower left direction (the near side) in the plane of paper in FIG. 6A.

As illustrated in FIGS. 6A and 6B, the current sensor 1 according to the present embodiment includes the first magnetic sensor 12a and the second magnetic sensor 12b, disposed around the current line 11, and includes the circuit substrate 13 in which the first magnetic sensor 12a and the second magnetic sensor 12b are disposed. In addition, the current sensor 1 includes an arithmetic device subjecting the output of the first magnetic sensor 12a and the output of the second magnetic sensor 12b to an arithmetic operation. In this point, the current sensor 1 illustrated in FIGS. 6A and 6B is in common with the current sensor 1 illustrated in FIGS. 2A and 2B.

In the current sensor 1 illustrated in FIGS. 6A and 6B, the first magnetic sensor 12a and the second magnetic sensor 12b are disposed around the current line 11 so that outputs whose phases are substantially opposite to each other are obtained owing to the induction magnetic field A from the current to be measured I flowing through the current line 11. Specifically, the main sensitivity axis direction (the arrow 14a) of the first magnetic sensor 12a is disposed so as to be oriented in the direction of the induction magnetic field A from the current to be measured I flowing through the current line 11, the main sensitivity axis direction (the arrow 14b) of the second magnetic sensor 12b is disposed so as to be oriented in a direction opposite to the direction of the induction magnetic field A from the current to be measured I flowing through the current line 11, and the individual main sensitivity axis directions of the first magnetic sensor 12a and the second magnetic sensor 12b are disposed so as to be oriented in the same direction. In addition, in a relationship with the induction magnetic field B from the adjacent current I' flowing through the adjacent current line 21, the sub-sensitivity axis direction (the arrow 15a (headed to the upper side of the plane of paper in FIG. 6B)) of the first magnetic sensor 12a is disposed so as to be equal to the direction (headed to the upper side of the plane of paper in FIG. 6B) of the sub-sensitivity axis component of an induction magnetic field Ba to which the first magnetic sensor 12a is subjected, and the sub-sensitivity axis direction (the arrow 15b (headed to the lower side of the plane of paper in FIG. 6B)) of the second magnetic sensor 12b is disposed so as to be equal to the direction (headed to the lower side of the plane of paper in FIG. 6B) of the sub-sensitivity axis component of an induction magnetic field Bb to which the second magnetic sensor 12b is subjected. In other words, the individual sub-sensitivity axis directions (the arrows 15a and 15b) of the first magnetic sensor 12a and the second magnetic sensor 12b are disposed so as to be oriented in directions equal to the directions of the sub-sensitivity axis components of the induction magnetic field B to which the first magnetic sensor 12a and the second magnetic sensor 12b are individually subjected from the adjacent current I'.

In the current sensor 1 illustrated in FIGS. 6A and 6B, since the main sensitivity axis direction of one of the first magnetic sensor 12a and the second magnetic sensor 12b is oriented in the direction of the induction magnetic field A, and the main sensitivity axis direction of the other is oriented in a direction opposite to the induction magnetic field A, the influence of the induction magnetic field A emerges as the output signals of the first magnetic sensor 12a and the second magnetic sensor 12b, whose phases are substantially opposite to each other. In addition, since the individual main sensitivity axis directions of the first magnetic sensor 12a and the second magnetic sensor 12b are oriented in the same direction, the influences of a disturbance magnetic field equally emerge in the output of the first magnetic sensor 12a and the output of the second magnetic sensor 12b. In addition, since the sub-sensitivity axis direction of one magnetic sensor is equal to the direction of the sub-sensitivity axis component of the induction magnetic field B, and the sub-sensitivity axis direction of the other magnetic sensor is also equal to the direction of the sub-sensitivity axis component of the induction magnetic field B, the influences of the induction magnetic field B due to the adjacent current I' emerge whose polarities are equal to each other, in the output of the first magnetic sensor 12a and the output of the second magnetic sensor 12b. Therefore, by obtaining a difference between the output of the first magnetic sensor 12a and the output of the second magnetic sensor 12b, it may be possible to reduce the influence of a disturbance magnetic field including the induction magnetic field B and suppress the reduction of current measurement accuracy.

In addition, in the current sensor 1 illustrated in FIGS. 6A and 6B, the individual main sensitivity axis directions (the arrows 14a and 14b) of the first magnetic sensor 12a and the second magnetic sensor 12b are oriented in the extending direction of the adjacent current line 21. In this case, since the main sensitivity axis direction of each of the first magnetic sensor 12a and the second magnetic sensor 12b turns out to be perpendicular to the direction of the induction magnetic field B, the influence of the induction magnetic field B does not emerge in the main sensitivity axis direction. Accordingly, it may be possible to remove the influence of the induction magnetic field B occurring from the adjacent current I' in the main sensitivity axis direction, and it may be possible to further suppress the reduction of current measurement accuracy.

Figure 7A:
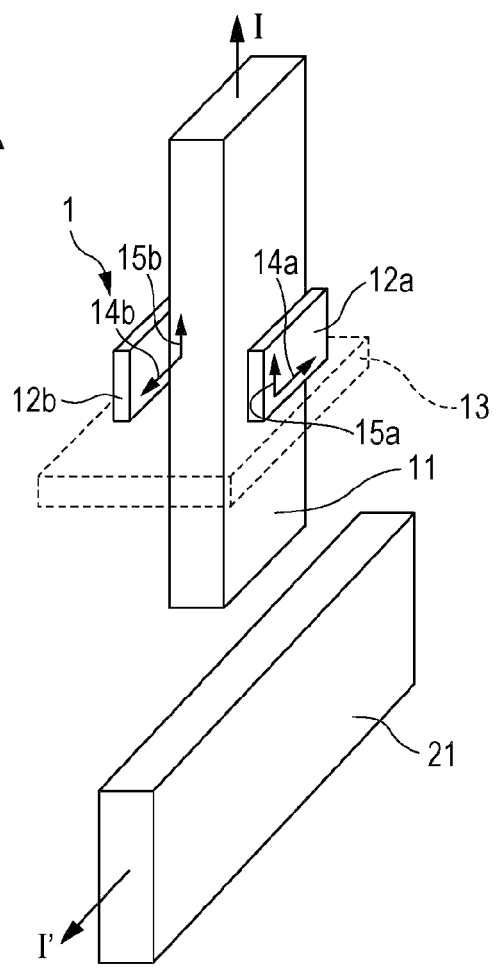
FIGS. 7A and 7B are pattern diagrams illustrating an example of a modification to the current sensor according to the second embodiment.
Figure 7B:
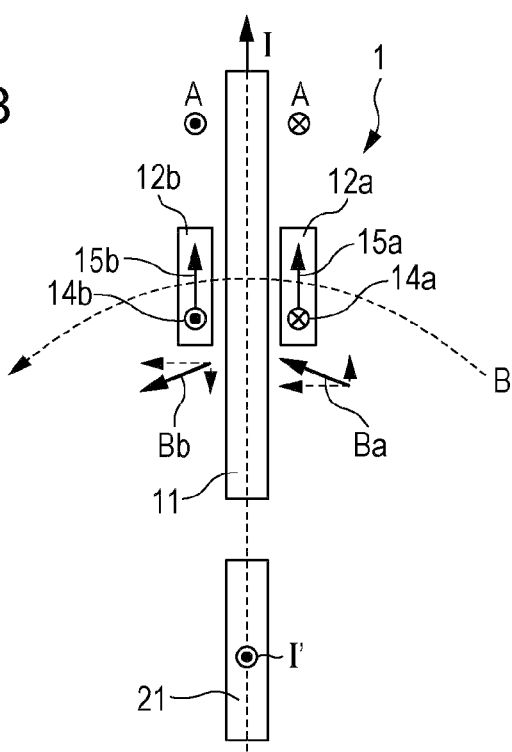

FIGS. 7A and 7B are pattern diagrams illustrating a current sensor 1 according to an example of a modification to the present embodiment. FIG. 7A is a perspective view schematically illustrating the current sensor 1 and the surrounding configuration thereof, and FIG. 7B is a plan view where the current sensor 1 is viewed from the lower left direction (the near side) in the plane of paper in FIG. 7A.

The basic configuration of the current sensor 1 illustrated in FIGS. 7A and 7B is the same as the current sensor 1 illustrated in FIGS. 6A and 6B. In other words, the current sensor 1 illustrated in FIGS. 7A and 7B includes the first magnetic sensor 12a, the second magnetic sensor 12b, the circuit substrate 13, the arithmetic device, and the like.

In the current sensor 1 illustrated in FIGS. 7A and 7B, the first magnetic sensor 12a and the second magnetic sensor 12b are disposed around the current line 11 so that outputs whose phases are substantially equal to each other are obtained owing to the induction magnetic field A from the current to be measured I flowing through the current line 11. Specifically, the main sensitivity axis direction (the arrow 14a) of the first magnetic sensor 12a is disposed so as to be oriented in the direction of the induction magnetic field A from the current to be measured I flowing through the current line 11, the main sensitivity axis direction (the arrow 14b) of the second magnetic sensor 12b is disposed so as to be oriented in the direction of the induction magnetic field A from the current to be measured I flowing through the current line 11, and the individual main sensitivity axis directions of the first magnetic sensor 12a and the second magnetic sensor 12b are disposed so as to be oriented in directions opposite to each other. In addition, in a relationship with the induction magnetic field B from the adjacent current I' flowing through the adjacent current line 21, the sub-sensitivity axis direction (the arrow 15a (headed to the upper side of the plane of paper in FIG. 7B)) of the first magnetic sensor 12a is disposed so as to be equal to the direction (headed to the upper side of the plane of paper in FIG. 7B) of the sub-sensitivity axis component of an induction magnetic field Ba to which the first magnetic sensor 12a is subjected, and the sub-sensitivity axis direction (the arrow 15b (headed to the upper side of the plane of paper in FIG. 7B)) of the second magnetic sensor 12b is disposed so as to be opposite to the direction (headed to the lower side of the plane of paper in FIG. 7B) of the sub-sensitivity axis component of an induction magnetic field Bb to which the second magnetic sensor 12b is subjected.

In the current sensor 1 illustrated in FIGS. 7A and 7B, since both of the individual main sensitivity axis directions of the first magnetic sensor 12a and the second magnetic sensor 12b are oriented in the direction of the induction magnetic field A, the influence of the induction magnetic field A emerges as the output signals of the first magnetic sensor 12a and the second magnetic sensor 12b, whose phases are substantially equal to each other. In addition, since the individual main sensitivity axis directions of the first magnetic sensor 12a and the second magnetic sensor 12b are oriented in directions opposite to each other, the influences of the disturbance magnetic field reversely emerge in the output of the first magnetic sensor 12a and the output of the second magnetic sensor 12b. In addition, since the sub-sensitivity axis direction of one magnetic sensor is equal to the direction of the sub-sensitivity axis component of the induction magnetic field B, and the sub-sensitivity axis direction of the other magnetic sensor is opposite to the direction of the sub-sensitivity axis component of the induction magnetic field B, the influences of the induction magnetic field B due to the adjacent current I' emerge whose polarities are opposite to each other, in the output of the first magnetic sensor 12a and the output of the second magnetic sensor 12b. Therefore, by obtaining the sum of the output of the first magnetic sensor 12a and the output of the second magnetic sensor 12b, it may be possible to reduce the influence of a disturbance magnetic field including the induction magnetic field B and suppress the reduction of current measurement accuracy. Here, in the current sensor 1 illustrated in FIGS. 7A and 7B, the arithmetic device 16 has a function for calculating the sum of the output of the first magnetic sensor 12a and the output of the second magnetic sensor 12b.

In addition, in the current sensor 1 illustrated in FIGS. 7A and 7B, the individual main sensitivity axis directions (the arrows 14a and 14b) of the first magnetic sensor 12a and the second magnetic sensor 12b are oriented in the extending direction of the adjacent current line 21. In this case, since the individual main sensitivity axis directions of the first magnetic sensor 12a and the second magnetic sensor 12b turn out to be perpendicular to the direction of the induction magnetic field B, the influence of the induction magnetic field B does not emerge in the main sensitivity axis directions. Accordingly, it may be possible to remove the influence of the induction magnetic field B occurring from the adjacent current I' in the main sensitivity axis direction, and it may be possible to further suppress the reduction of current measurement accuracy.

As described above, it may be possible for the current sensor 1 according to the present embodiment to reduce the influence of the induction magnetic field B and suppress the reduction of current measurement accuracy. The reason is that, in the current sensor 1 according to the present embodiment, the first magnetic sensor 12a and the second magnetic sensor 12b are disposed so that it may be possible to adequately cancel out the influence of the induction magnetic field B in the sub-sensitivity axis direction. In addition, since it may be possible for the current sensor 1 according to the present embodiment to reduce the influence of the induction magnetic field B, it may be possible to narrow a distance between the current line 11 and the adjacent current line 21. Therefore, it may be possible to achieve the miniaturization of a system including the current sensor 1 and saving of the space thereof.

In addition, in FIGS. 6A and 6B, the main sensitivity axis direction of the first magnetic sensor 12a may also be oriented in a direction opposite to the direction of the induction magnetic field A, and the main sensitivity axis direction of the second magnetic sensor 12b may also be oriented in the direction of the induction magnetic field A. In addition, the sub-sensitivity axis direction of the first magnetic sensor 12a may also be opposite to the direction of the sub-sensitivity axis component of the induction magnetic field Ba to which the first magnetic sensor 12a is subjected, and the sub-sensitivity axis direction of the second magnetic sensor 12b may also be opposite to the direction of the sub-sensitivity axis component of the induction magnetic field Bb to which the second magnetic sensor 12b is subjected. In other words, the individual sub-sensitivity axis directions of the first magnetic sensor 12a and the second magnetic sensor 12b may also be opposite to the directions of the sub-sensitivity axis components of the induction magnetic field B to which the first magnetic sensor 12a and the second magnetic sensor 12b are individually subjected from the adjacent current I'.

In addition, in FIGS. 7A and 7B, both of the main sensitivity axis directions of the first magnetic sensor 12a and the second magnetic sensor 12b may also be oriented in directions opposite to the direction of the induction magnetic field A. In addition, the sub-sensitivity axis direction of the first magnetic sensor 12a may also be opposite to the direction of the sub-sensitivity axis component of the induction magnetic field Ba to which the first magnetic sensor 12a is subjected, and the sub-sensitivity axis direction of the second magnetic sensor 12b may also be equal to the direction of the sub-sensitivity axis component of the induction magnetic field Bb to which the second magnetic sensor 12b is subjected.

In addition to this, the present embodiment may be arbitrarily combined with a configuration illustrated in another embodiment, and implemented.

Third Embodiment

Figure 8A:
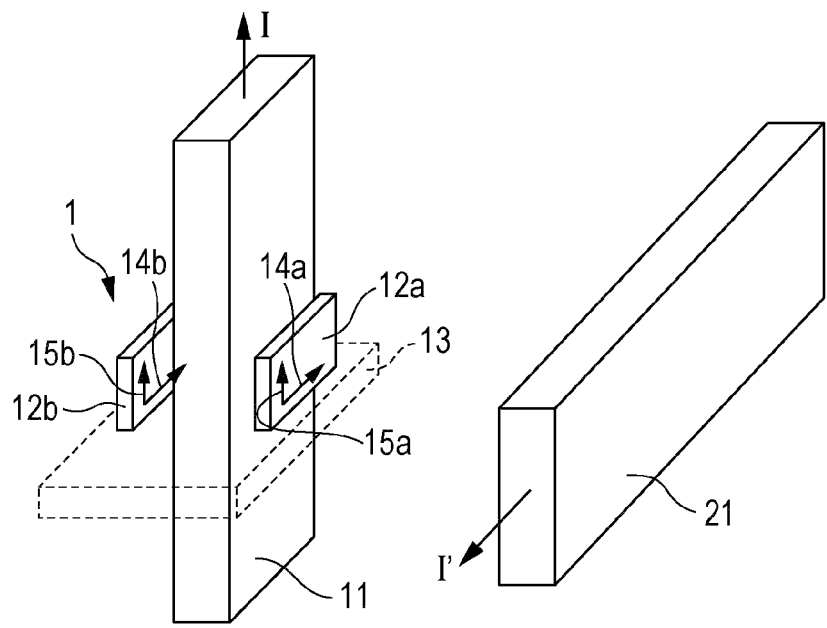
FIGS. 8A and 8B are pattern diagrams illustrating an example of a configuration of a current sensor according to a third embodiment.
Figure 8B:
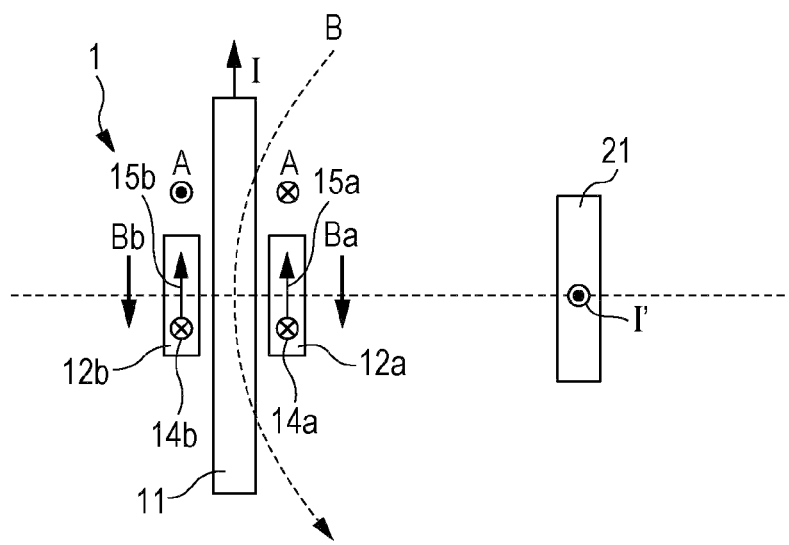

In the present embodiment, an example of another configuration of the current sensor 1 of the present invention will be described. FIGS. 8A and 8B are pattern diagrams illustrating the current sensor 1 according to the present embodiment. FIG. 8A is a perspective view schematically illustrating the current sensor 1 and the surrounding configuration thereof, and FIG. 8B is a plan view where the current sensor 1 is viewed from the lower left direction (the near side) in the plane of paper in FIG. 8A.

As illustrated in FIGS. 8A and 8B, the current sensor 1 according to the present embodiment includes the first magnetic sensor 12a and the second magnetic sensor 12b, disposed around the current line 11, and includes the circuit substrate 13 in which the first magnetic sensor 12a and the second magnetic sensor 12b are disposed. In addition, the current sensor 1 includes an arithmetic device subjecting the output of the first magnetic sensor 12a and the output of the second magnetic sensor 12b to an arithmetic operation. In this point, the current sensor 1 illustrated in FIGS. 8A and 8B is in common with the current sensor 1 illustrated in FIGS. 2A and 2B.

In the current sensor 1 illustrated in FIGS. 8A and 8B, the first magnetic sensor 12a and the second magnetic sensor 12b are disposed around the current line 11 so that outputs whose phases are substantially opposite to each other are obtained owing to the induction magnetic field A from the current to be measured I flowing through the current line 11. Specifically, the main sensitivity axis direction (the arrow 14a) of the first magnetic sensor 12a is disposed so as to be oriented in the direction of the induction magnetic field A from the current to be measured I flowing through the current line 11, the main sensitivity axis direction (the arrow 14b) of the second magnetic sensor 12b is disposed so as to be oriented in a direction opposite to the direction of the induction magnetic field A from the current to be measured I flowing through the current line 11, and the individual main sensitivity axis directions of the first magnetic sensor 12a and the second magnetic sensor 12b are disposed so as to be oriented in the same direction. In addition, in a relationship with the induction magnetic field B from the adjacent current I' flowing through the adjacent current line 21, the sub-sensitivity axis direction (the arrow 15a (headed to the upper side of the plane of paper in FIG. 8B)) of the first magnetic sensor 12a is disposed so as to be opposite to the direction (headed to the lower side of the plane of paper in FIG. 8B) of the sub-sensitivity axis component of an induction magnetic field Ba to which the first magnetic sensor 12a is subjected, and the sub-sensitivity axis direction (the arrow 15b (headed to the upper side of the plane of paper in FIG. 8B)) of the second magnetic sensor 12b is disposed so as to be opposite to the direction (headed to the lower side of the plane of paper in FIG. 8B) of the sub-sensitivity axis component of an induction magnetic field Bb to which the second magnetic sensor 12b is subjected. In other words, the individual sub-sensitivity axis directions (the arrows 15a and 15b) of the first magnetic sensor 12a and the second magnetic sensor 12b are disposed so as to be oriented in directions opposite to the directions of the sub-sensitivity axis components of the induction magnetic field B to which the first magnetic sensor 12a and the second magnetic sensor 12b are individually subjected from the adjacent current I'. In addition, in the first magnetic sensor 12a and the second magnetic sensor 12b, the induction magnetic field B only has sub-sensitivity axis components, and the sub-sensitivity axis components of the induction magnetic field Ba and the induction magnetic field Bb are the induction magnetic field Ba and the induction magnetic field Bb themselves.

In the current sensor 1 illustrated in FIGS. 8A and 8B, since the main sensitivity axis direction of one of the first magnetic sensor 12a and the second magnetic sensor 12b is oriented in the direction of the induction magnetic field A, and the main sensitivity axis direction of the other is oriented in a direction opposite to the induction magnetic field A, the influence of the induction magnetic field A emerges as the output signals of the first magnetic sensor 12a and the second magnetic sensor 12b, whose phases are substantially opposite to each other. In addition, since the individual main sensitivity axis directions of the first magnetic sensor 12a and the second magnetic sensor 12b are oriented in the same direction, the influences of a disturbance magnetic field equally emerge in the output of the first magnetic sensor 12a and the output of the second magnetic sensor 12b. In addition, since the sub-sensitivity axis direction of one magnetic sensor is opposite to the direction of the sub-sensitivity axis component of the induction magnetic field B, and the sub-sensitivity axis direction of the other magnetic sensor is also opposite to the direction of the sub-sensitivity axis component of the induction magnetic field B, the influences of the induction magnetic field B due to the adjacent current I' emerge whose polarities are equal to each other, in the output of the first magnetic sensor 12a and the output of the second magnetic sensor 12b. Therefore, by obtaining a difference between the output of the first magnetic sensor 12a and the output of the second magnetic sensor 12b, it may be possible to reduce the influence of a disturbance magnetic field including the induction magnetic field B and suppress the reduction of current measurement accuracy.

In addition, in the current sensor 1 illustrated in FIGS. 8A and 8B, the individual main sensitivity axis directions (the arrows 14a and 14b) of the first magnetic sensor 12a and the second magnetic sensor 12b are oriented in the extending direction of the adjacent current line 21. In this case, since the individual main sensitivity axis directions of the first magnetic sensor 12a and the second magnetic sensor 12b turn out to be perpendicular to the direction of the induction magnetic field B, the influence of the induction magnetic field B does not emerge in the main sensitivity axis directions. Accordingly, it may be possible to remove the influence of the induction magnetic field B occurring from the adjacent current I' in the main sensitivity axis direction, and it may be possible to further suppress the reduction of current measurement accuracy.

Figure 9A:
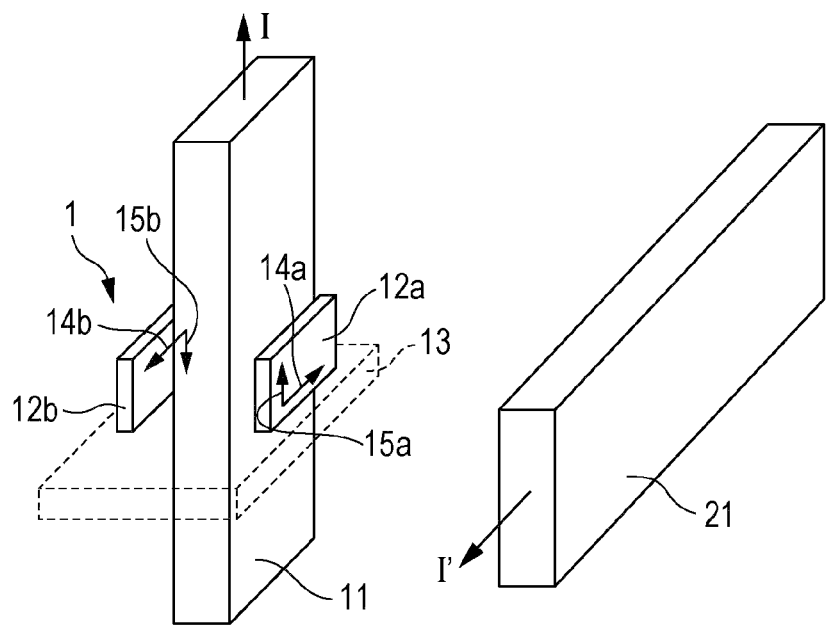
FIGS. 9A and 9B are pattern diagrams illustrating an example of a modification to the current sensor according to the third embodiment.
Figure 9B:
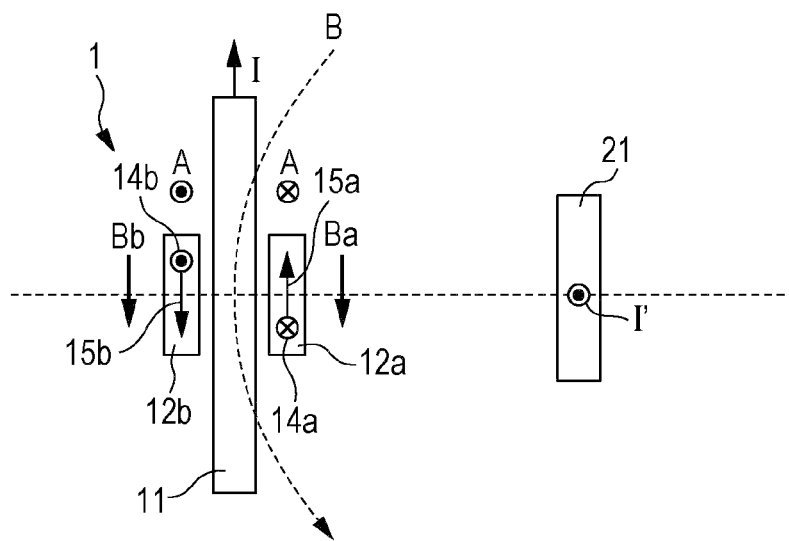

FIGS. 9A and 9B are pattern diagrams illustrating a current sensor 1 according to an example of a modification to the present embodiment. FIG. 9A is a perspective view schematically illustrating the current sensor 1 and the surrounding configuration thereof, and FIG. 9B is a plan view where the current sensor 1 is viewed from the lower left direction (the near side) in the plane of paper in FIG. 9A.

The basic configuration of the current sensor 1 illustrated in FIGS. 9A and 9B is the same as the current sensor 1 illustrated in FIGS. 8A and 8B. In other words, the current sensor 1 illustrated in FIGS. 9A and 9B includes the first magnetic sensor 12a, the second magnetic sensor 12b, the circuit substrate 13, the arithmetic device, and the like.

In the current sensor 1 illustrated in FIGS. 9A and 9B, the first magnetic sensor 12a and the second magnetic sensor 12b are disposed around the current line 11 so that outputs whose phases are substantially equal to each other are obtained owing to the induction magnetic field A from the current to be measured I flowing through the current line 11. Specifically, the main sensitivity axis direction (the arrow 14a) of the first magnetic sensor 12a is disposed so as to be oriented in the direction of the induction magnetic field A from the current to be measured I flowing through the current line 11, the main sensitivity axis direction (the arrow 14b) of the second magnetic sensor 12b is disposed so as to be oriented in the direction of the induction magnetic field A from the current to be measured I flowing through the current line 11, and the individual main sensitivity axis directions of the first magnetic sensor 12a and the second magnetic sensor 12b are disposed so as to be oriented in directions opposite to each other. In addition, in a relationship with the induction magnetic field B from the adjacent current I' flowing through the adjacent current line 21, the sub-sensitivity axis direction (the arrow 15a (headed to the upper side of the plane of paper in FIG. 9B)) of the first magnetic sensor 12a is disposed so as to be opposite to the direction (headed to the lower side of the plane of paper in FIG. 9B) of the sub-sensitivity axis component of an induction magnetic field Ba to which the first magnetic sensor 12a is subjected, and the sub-sensitivity axis direction (the arrow 15b (headed to the lower side of the plane of paper in FIG. 9B)) of the second magnetic sensor 12b is disposed so as to be equal to the direction (headed to the lower side of the plane of paper in FIG. 9B) of the sub-sensitivity axis component of an induction magnetic field Bb to which the second magnetic sensor 12b is subjected. In addition, in the first magnetic sensor 12a and the second magnetic sensor 12b, the induction magnetic field B only has sub-sensitivity axis components, and the sub-sensitivity axis components of the induction magnetic field Ba and the induction magnetic field Bb are the induction magnetic field Ba and the induction magnetic field Bb themselves.

In the current sensor 1 illustrated in FIGS. 9A and 9B, since both of the individual main sensitivity axis directions of the first magnetic sensor 12a and the second magnetic sensor 12b are oriented in the direction of the induction magnetic field A, the influence of the induction magnetic field A emerges as the output signals of the first magnetic sensor 12a and the second magnetic sensor 12b, whose phases are substantially equal to each other. In addition, since the individual main sensitivity axis directions of the first magnetic sensor 12a and the second magnetic sensor 12b are oriented in directions opposite to each other, the influences of a disturbance magnetic field reversely emerge in the output of the first magnetic sensor 12a and the output of the second magnetic sensor 12b. In addition, since the sub-sensitivity axis direction of one magnetic sensor is equal to the direction of the sub-sensitivity axis component of the induction magnetic field B, and the sub-sensitivity axis direction of the other magnetic sensor is opposite to the direction of the sub-sensitivity axis component of the induction magnetic field B, the influences of the induction magnetic field B due to the adjacent current I' emerge whose polarities are opposite to each other, in the output of the first magnetic sensor 12a and the output of the second magnetic sensor 12b. Therefore, by obtaining the sum of the output of the first magnetic sensor 12a and the output of the second magnetic sensor 12b, it may be possible to reduce the influence of a disturbance magnetic field including the induction magnetic field B and suppress the reduction of current measurement accuracy. Here, in the current sensor 1 illustrated in FIGS. 9A and 9B, the arithmetic device 16 has a function for calculating the sum of the output of the first magnetic sensor 12a and the output of the second magnetic sensor 12b.

In addition, in the current sensor 1 illustrated in FIGS. 9A and 9B, the individual main sensitivity axis directions (the arrows 14a and 14b) of the first magnetic sensor 12a and the second magnetic sensor 12b are oriented in the extending direction of the adjacent current line 21. In this case, since the individual main sensitivity axis directions of the first magnetic sensor 12a and the second magnetic sensor 12b turn out to be perpendicular to the direction of the induction magnetic field B, the influence of the induction magnetic field B does not emerge in the main sensitivity axis directions. Accordingly, it may be possible to remove the influence of the induction magnetic field B occurring from the adjacent current I' in the main sensitivity axis direction, and it may be possible to further suppress the reduction of current measurement accuracy.

As described above, it may be possible for the current sensor 1 according to the present embodiment to reduce the influence of the induction magnetic field B and suppress the reduction of current measurement accuracy. The reason is that, in the current sensor 1 according to the present embodiment, the first magnetic sensor 12a and the second magnetic sensor 12b are disposed so that it may be possible to adequately cancel out the influence of the induction magnetic field B in the sub-sensitivity axis direction. In addition, since it may be possible for the current sensor 1 according to the present embodiment to reduce the influence of the induction magnetic field B, it may be possible to narrow a distance between the current line 11 and the adjacent current line 21. Therefore, it may be possible to achieve the miniaturization of a system including the current sensor 1 and saving of the space thereof.

In addition, in FIGS. 8A and 8B, the main sensitivity axis direction of the first magnetic sensor 12a may also be oriented in a direction opposite to the direction of the induction magnetic field A, and the main sensitivity axis direction of the second magnetic sensor 12b may also be oriented in the direction of the induction magnetic field A. In addition, the sub-sensitivity axis direction of the first magnetic sensor 12a may also be equal to the direction of the sub-sensitivity axis component of the induction magnetic field Ba to which the first magnetic sensor 12a is subjected, and the sub-sensitivity axis direction of the second magnetic sensor 12b may also be equal to the direction of the sub-sensitivity axis component of the induction magnetic field Bb to which the second magnetic sensor 12b is subjected. In other words, the individual sub-sensitivity axis directions of the first magnetic sensor 12a and the second magnetic sensor 12b may also be equal to the directions of the sub-sensitivity axis components of the induction magnetic field B to which the first magnetic sensor 12a and the second magnetic sensor 12b are individually subjected.

In addition, in FIGS. 9A and 9B, both of the main sensitivity axis directions of the first magnetic sensor 12a and the second magnetic sensor 12b may also be oriented in directions opposite to the direction of the induction magnetic field A. In addition, the sub-sensitivity axis direction of the first magnetic sensor 12a may also be equal to the direction of the sub-sensitivity axis component of the induction magnetic field Ba to which the first magnetic sensor 12a is subjected, and the sub-sensitivity axis direction of the second magnetic sensor 12b may also be opposite to the direction of the sub-sensitivity axis component of the induction magnetic field Bb to which the second magnetic sensor 12b is subjected.

In addition to this, the present embodiment may be arbitrarily combined with a configuration illustrated in another embodiment, and implemented.

Fourth Embodiment

Figure 10A:
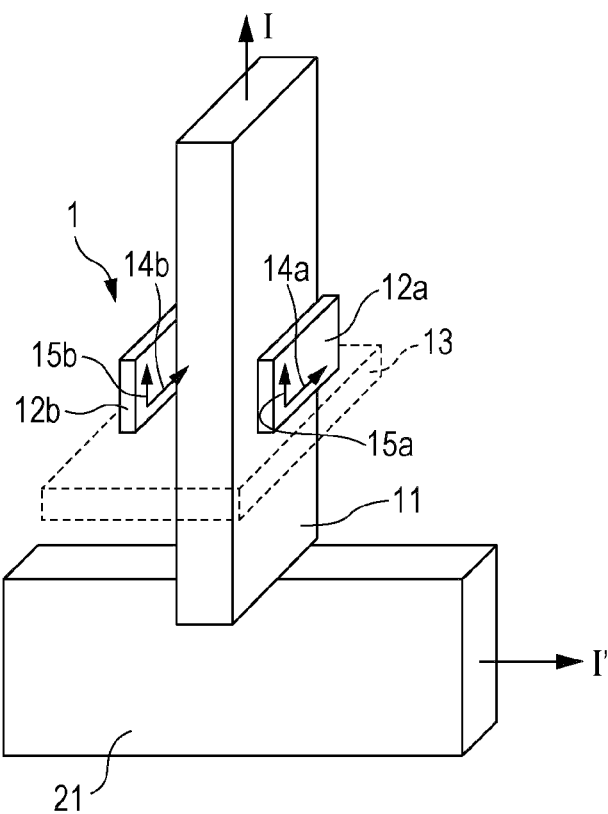
FIGS. 10A and 10B are pattern diagrams illustrating an example of a configuration of a current sensor according to a fourth embodiment.
Figure 10B:
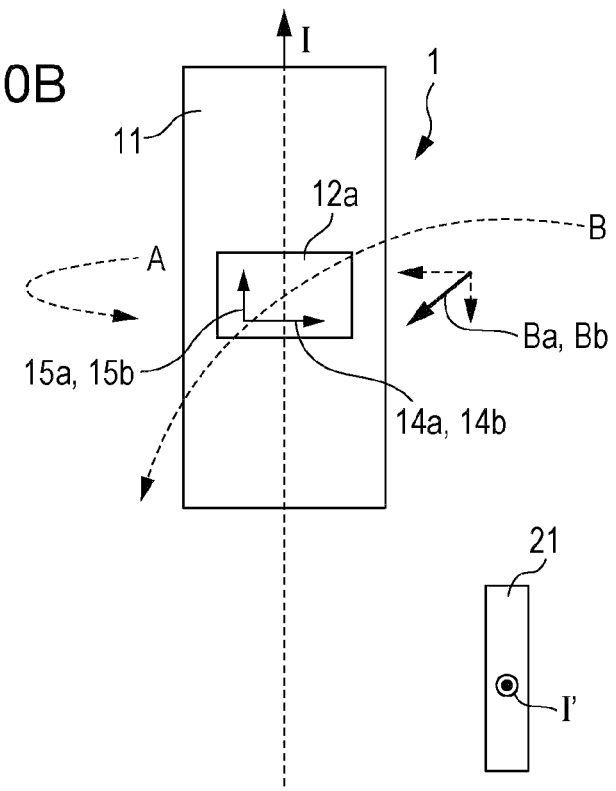

In the present embodiment, an example of another configuration of the current sensor 1 of the present invention will be described. FIGS. 10A and 10B are pattern diagrams illustrating the current sensor 1 according to the present embodiment. FIG. 10A is a perspective view schematically illustrating the current sensor 1 and the surrounding configuration thereof, and FIG. 10B is a plan view where the current sensor 1 is viewed from the right direction in the plane of paper in FIG. 10A.

As illustrated in FIGS. 10A and 10B, the current sensor 1 according to the present embodiment includes the first magnetic sensor 12a and the second magnetic sensor 12b, disposed around the current line 11, and includes the circuit substrate 13 in which the first magnetic sensor 12a and the second magnetic sensor 12b are disposed. In addition, the current sensor 1 includes an arithmetic device subjecting the output of the first magnetic sensor 12a and the output of the second magnetic sensor 12b to an arithmetic operation. In this point, the current sensor 1 illustrated in FIGS. 10A and 10B is in common with the current sensor 1 illustrated in FIGS. 2A and 2B.

In the current sensor 1 illustrated in FIGS. 10A and 10B, the first magnetic sensor 12a and the second magnetic sensor 12b are disposed around the current line 11 so that outputs whose phases are substantially opposite to each other are obtained owing to the induction magnetic field A from the current to be measured I flowing through the current line 11. Specifically, the main sensitivity axis direction (the arrow 14a) of the first magnetic sensor 12a is disposed so as to be oriented in the direction of the induction magnetic field A from the current to be measured I flowing through the current line 11, the main sensitivity axis direction (the arrow 14b) of the second magnetic sensor 12b is disposed so as to be oriented in a direction opposite to the direction of the induction magnetic field A from the current to be measured I flowing through the current line 11, and the individual main sensitivity axis directions of the first magnetic sensor 12a and the second magnetic sensor 12b are disposed so as to be oriented in the same direction. In addition, in a relationship with the induction magnetic field B from the adjacent current I' flowing through the adjacent current line 21, the sub-sensitivity axis direction (the arrow 15a (headed to the upper side of the plane of paper in FIG. 10B)) of the first magnetic sensor 12a is disposed so as to be opposite to the direction (headed to the lower side of the plane of paper in FIG. 10B) of the sub-sensitivity axis component of an induction magnetic field Ba to which the first magnetic sensor 12a is subjected, and the sub-sensitivity axis direction (the arrow 15b (headed to the upper side of the plane of paper in FIG. 10B)) of the second magnetic sensor 12b is disposed so as to be opposite to the direction (headed to the lower side of the plane of paper in FIG. 10B) of the sub-sensitivity axis component of an induction magnetic field Bb to which the second magnetic sensor 12b is subjected. In other words, the individual sub-sensitivity axis directions (the arrows 15a and 15b) of the first magnetic sensor 12a and the second magnetic sensor 12b are disposed so as to be oriented in directions opposite to the directions of the sub-sensitivity axis components of the induction magnetic field B to which the first magnetic sensor 12a and the second magnetic sensor 12b are individually subjected from a current flowing through the adjacent current I'.

In the current sensor 1 illustrated in FIGS. 10A and 10B, since the main sensitivity axis direction of one of the first magnetic sensor 12a and the second magnetic sensor 12b is oriented in the direction of the induction magnetic field A, and the main sensitivity axis direction of the other is oriented in a direction opposite to the induction magnetic field A, the influence of the induction magnetic field A emerges as the output signals of the first magnetic sensor 12a and the second magnetic sensor 12b, whose phases are substantially opposite to each other. In addition, since the individual main sensitivity axis directions of the first magnetic sensor 12a and the second magnetic sensor 12b are oriented in the same direction, the influences of a disturbance magnetic field equally emerge in the output of the first magnetic sensor 12a and the output of the second magnetic sensor 12b. In addition, since the sub-sensitivity axis direction of one magnetic sensor is opposite to the direction of the sub-sensitivity axis component of the induction magnetic field B, and the sub-sensitivity axis direction of the other magnetic sensor is also opposite to the direction of the sub-sensitivity axis component of the induction magnetic field B, the influences of the induction magnetic field B due to the adjacent current I' emerge whose polarities are equal to each other, in the output of the first magnetic sensor 12a and the output of the second magnetic sensor 12b. Therefore, by obtaining a difference between the output of the first magnetic sensor 12a and the output of the second magnetic sensor 12b, it may be possible to reduce the influence of a disturbance magnetic field including the induction magnetic field B and suppress the reduction of current measurement accuracy.

In addition, in the current sensor 1 illustrated in FIGS. 10A and 10B, the main sensitivity axis direction ((the arrow 14a (headed to the right side of the plane of paper in FIG. 10B)) of the first magnetic sensor 12a is disposed so as to be opposite to the direction (headed to the left side of the plane of paper in FIG. 10B) of the main sensitivity axis component of an induction magnetic field Ba to which the first magnetic sensor 12a is subjected, and the main sensitivity axis direction (the arrow 14b (headed to the right side of the plane of paper in FIG. 10B)) of the second magnetic sensor 12b is disposed so as to be opposite to the direction (headed to the left side of the plane of paper in FIG. 10B) of the main sensitivity axis component of an induction magnetic field Bb to which the second magnetic sensor 12b is subjected. In other words, the individual main sensitivity axis directions (the arrows 14a and 14b) of the first magnetic sensor 12a and the second magnetic sensor 12b are disposed so as to be oriented in directions opposite to the directions of the main sensitivity axis components of the induction magnetic field B to which the first magnetic sensor 12a and the second magnetic sensor 12b are individually subjected from the adjacent current I'. In this case, the influence of the induction magnetic field B, to which the main sensitivity axis of the first magnetic sensor 12a is subjected, and the influence of the induction magnetic field B, to which the main sensitivity axis of the second magnetic sensor 12b is subjected, have polarities equal to each other. Therefore, by obtaining a difference between the output of the first magnetic sensor 12a and the output of the second magnetic sensor 12b, it may be possible to reduce the influence of the induction magnetic field B emerging in the main sensitivity axis direction in addition to the sub-sensitivity axis direction. Accordingly, it may be possible to further suppress the reduction of current measurement accuracy.

In addition, even if the individual main sensitivity axis directions (the arrows 14a and 14b) of the first magnetic sensor 12a and the second magnetic sensor 12b are directions equal to the directions of the main sensitivity axis components of the induction magnetic field B to which the first magnetic sensor 12a and the second magnetic sensor 12b are individually subjected from the adjacent current I', it may be possible to obtain the same advantageous effect.

Figure 11A:
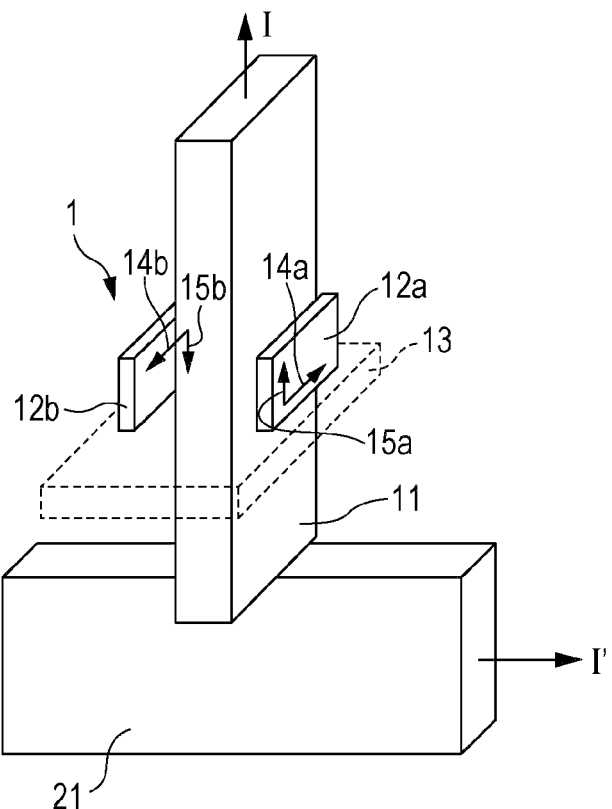
FIGS. 11A and 11B are pattern diagrams illustrating an example of a modification to the current sensor according to the fourth embodiment.
Figure 11B:
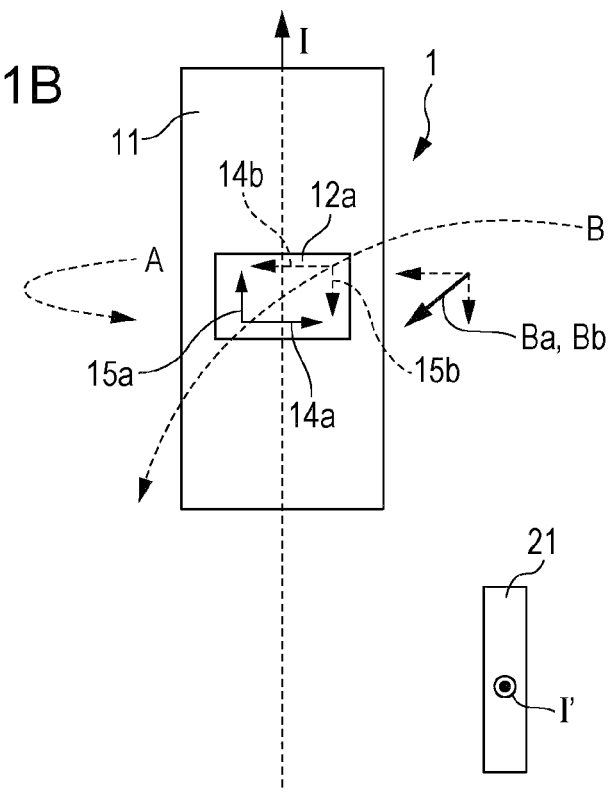

FIGS. 11A and 11B are pattern diagrams illustrating a current sensor 1 according to an example of a modification to the present embodiment. FIG. 11A is a perspective view schematically illustrating the current sensor 1 and the surrounding configuration thereof, and FIG. 11B is a plan view where the current sensor 1 is viewed from the right direction in the plane of paper in FIG. 11A.

The basic configuration of the current sensor 1 illustrated in FIGS. 11A and 11B is the same as the current sensor 1 illustrated in FIGS. 10A and 10B. In other words, the current sensor 1 illustrated in FIGS. 11A and 11B includes the first magnetic sensor 12a, the second magnetic sensor 12b, the circuit substrate 13, the arithmetic device, and the like.

In the current sensor 1 illustrated in FIGS. 11A and 11B, the first magnetic sensor 12a and the second magnetic sensor 12b are disposed around the current line 11 so that outputs whose phases are substantially equal to each other are obtained owing to the induction magnetic field A from the current to be measured I flowing through the current line 11. Specifically, the main sensitivity axis direction (the arrow 14a) of the first magnetic sensor 12a is disposed so as to be oriented in the direction of the induction magnetic field A from the current to be measured I flowing through the current line 11, the main sensitivity axis direction (the arrow 14b) of the second magnetic sensor 12b is disposed so as to be oriented in the direction of the induction magnetic field A from the current to be measured I flowing through the current line 11, and the individual main sensitivity axis directions of the first magnetic sensor 12a and the second magnetic sensor 12b are disposed so as to be oriented in directions opposite to each other. In addition, in a relationship with the induction magnetic field B from the adjacent current I' flowing through the adjacent current line 21, the sub-sensitivity axis direction (the arrow 15a (headed to the upper side of the plane of paper in FIG. 11B)) of the first magnetic sensor 12a is disposed so as to be opposite to the direction (headed to the lower side of the plane of paper in FIG. 11B) of the sub-sensitivity axis component of an induction magnetic field Ba to which the first magnetic sensor 12a is subjected, and the sub-sensitivity axis direction (the arrow 15b (headed to the lower side of the plane of paper in FIG. 11B)) of the second magnetic sensor 12b is disposed so as to be equal to the direction (headed to the lower side of the plane of paper in FIG. 11B) of the sub-sensitivity axis component of an induction magnetic field Bb to which the second magnetic sensor 12b is subjected.

In the current sensor 1 illustrated in FIGS. 11A and 11B, since both of the individual main sensitivity axis directions of the first magnetic sensor 12a and the second magnetic sensor 12b are oriented in the direction of the induction magnetic field A, the influence of the induction magnetic field A emerges as the output signals of the first magnetic sensor 12a and the second magnetic sensor 12b, whose phases are substantially equal to each other. In addition, since the individual main sensitivity axis directions of the first magnetic sensor 12a and the second magnetic sensor 12b are oriented in directions opposite to each other, the influences of a disturbance magnetic field reversely emerge in the output of the first magnetic sensor 12a and the output of the second magnetic sensor 12b. In addition, since the sub-sensitivity axis direction of one magnetic sensor is equal to the direction of the sub-sensitivity axis component of the induction magnetic field B, and the sub-sensitivity axis direction of the other magnetic sensor is opposite to the direction of the sub-sensitivity axis component of the induction magnetic field B, the influences of the induction magnetic field B due to the adjacent current I' emerge whose polarities are opposite to each other, in the output of the first magnetic sensor 12a and the output of the second magnetic sensor 12b. Therefore, by obtaining the sum of the output of the first magnetic sensor 12a and the output of the second magnetic sensor 12b, it may be possible to reduce the influence of a disturbance magnetic field including the induction magnetic field B and suppress the reduction of current measurement accuracy. Here, in the current sensor 1 illustrated in FIGS. 11A and 11B, the arithmetic device 16 has a function for calculating the sum of the output of the first magnetic sensor 12a and the output of the second magnetic sensor 12b.

In addition, in the current sensor 1 illustrated in FIGS. 11A and 11B, the main sensitivity axis direction ((the arrow 14a (headed to the right side of the plane of paper in FIG. 11B)) of the first magnetic sensor 12a is disposed so as to be opposite to the direction (headed to the left side of the plane of paper in FIG. 11B) of the main sensitivity axis component of an induction magnetic field Ba to which the first magnetic sensor 12a is subjected, and the main sensitivity axis direction (the arrow 14b (headed to the left side of the plane of paper in FIG. 11B)) of the second magnetic sensor 12b is disposed so as to be equal to the direction (headed to the left side of the plane of paper in FIG. 11B) of the main sensitivity axis component of an induction magnetic field Bb to which the second magnetic sensor 12b is subjected. In other words, the main sensitivity axis direction of one magnetic sensor is disposed so as to be equal to the direction of the main sensitivity axis component of the induction magnetic field B, and the main sensitivity axis direction of the other magnetic sensor is disposed so as to be opposite to the direction of the main sensitivity axis component of the induction magnetic field B. In this case, since the influence of the induction magnetic field B, to which the main sensitivity axis of the first magnetic sensor 12a is subjected, and the influence of the induction magnetic field B, to which the main sensitivity axis of the second magnetic sensor 12b is subjected, have polarities opposite to each other. Therefore, by obtaining the sum of the output of the first magnetic sensor 12a and the output of the second magnetic sensor 12b, it may be possible to reduce the influence of the induction magnetic field B emerging in the main sensitivity axis direction in addition to the sub-sensitivity axis direction. Accordingly, it may be possible to further suppress the reduction of current measurement accuracy.

In addition, even if the main sensitivity axis direction of the first magnetic sensor 12a is equal to the direction of the main sensitivity axis component of the induction magnetic field Ba to which the first magnetic sensor 12a is subjected, and the main sensitivity axis direction of the second magnetic sensor 12b is opposite to the direction of the main sensitivity axis component of the induction magnetic field Bb to which the second magnetic sensor 12b is subjected, it may be possible to obtain the same advantageous effect.

As described above, it may be possible for the current sensor 1 according to the present embodiment to reduce the influence of the induction magnetic field B and suppress the reduction of current measurement accuracy. The reason is that, in the current sensor 1 according to the present embodiment, the first magnetic sensor 12a and the second magnetic sensor 12b are disposed so that it may be possible to adequately cancel out the influence of the induction magnetic field B in the sub-sensitivity axis direction. In addition, since it may be possible for the current sensor 1 according to the present embodiment to reduce the influence of the induction magnetic field B, it may be possible to narrow a distance between the current line 11 and the adjacent current line 21. Therefore, it may be possible to achieve the miniaturization of a system including the current sensor 1 and saving of the space thereof.

In addition, in FIGS. 10A and 10B, the main sensitivity axis direction of the first magnetic sensor 12a may also be oriented in a direction opposite to the direction of the induction magnetic field A, and the main sensitivity axis direction of the second magnetic sensor 12b may also be oriented in the direction of the induction magnetic field A. In addition, the sub-sensitivity axis direction of the first magnetic sensor 12a may also be equal to the direction of the sub-sensitivity axis component of the induction magnetic field Ba to which the first magnetic sensor 12a is subjected, and the sub-sensitivity axis direction of the second magnetic sensor 12b may also be equal to the direction of the sub-sensitivity axis component of the induction magnetic field Bb to which the second magnetic sensor 12b is subjected. In other words, the individual sub-sensitivity axis directions of the first magnetic sensor 12a and the second magnetic sensor 12b may also be equal to the directions of the sub-sensitivity axis components of the induction magnetic field B to which the first magnetic sensor 12a and the second magnetic sensor 12b are individually subjected.

In addition, in FIGS. 11A and 11B, both of the main sensitivity axis directions of the first magnetic sensor 12a and the second magnetic sensor 12b may also be oriented in directions opposite to the direction of the induction magnetic field A. In addition, the sub-sensitivity axis direction of the first magnetic sensor 12a may also be equal to the direction of the sub-sensitivity axis component of the induction magnetic field Ba to which the first magnetic sensor 12a is subjected, and the sub-sensitivity axis direction of the second magnetic sensor 12b may also be opposite to the direction of the sub-sensitivity axis component of the induction magnetic field Bb to which the second magnetic sensor 12b is subjected.

In addition to this, the present embodiment may be arbitrarily combined with a configuration illustrated in another embodiment, and implemented.

Fifth Embodiment

In the present embodiment, another example of the current sensor 1 of the present invention will be described. The current sensor 1 of the present embodiment corresponds to a current sensor where magnetic sensors utilizing magnetoresistance effect elements are applied to the first magnetic sensor 12a and the second magnetic sensor 12b in the current sensor 1 described in one of the first embodiment to the fourth embodiment.

The first magnetic sensor 12a and the second magnetic sensor 12b according to the present embodiment are magnetic proportional type sensors or magnetic balance type sensors. The magnetic proportional type sensor is configured so as to include, for example, a bridge circuit including two magnetoresistance effect elements serving as magnetic sensor elements and two fixed resistance elements. In addition, the magnetic balance type sensor is configured so as to include, for example, a bridge circuit including two magnetoresistance effect elements serving as magnetic sensor elements and two fixed resistance elements, and a feedback coil disposed so as to be capable of generating a magnetic field in a direction cancelling out a magnetic field generated by a current to be measured. In a case where the magnetic proportional type sensor is adopted, since such a configuration as the magnetic balance type sensor, which relates to the feedback coil and the control thereof, becomes unnecessary, it may be possible to simplify a configuration and achieve the miniaturization of a current sensor. On the other hand, when the magnetic balance type sensor is adopted, it may be possible to easily realize a current sensor whose response speed is high and whose temperature dependency is small.

While examples of the magnetoresistance effect elements used for the first magnetic sensor 12a and the second magnetic sensor 12b include a giant magneto resistance (GMR) element, a tunnel magneto resistance (TMR) element, and the like, here the GMR element is used that also has a sensitivity in a direction perpendicular to a sensitivity axis. The magnetoresistance effect element such as the GMR element has a property that a resistance value changes owing to the application of an induction magnetic field from a current to be measured, and using this for the first magnetic sensor 12a and the second magnetic sensor 12b, it may be possible to detect the intensity of an induction magnetic field.

It is desirable that the first magnetic sensor 12a and the second magnetic sensor 12b include elements that are manufactured using the same wafer and have the same structure. Since, in such magnetic sensors, it may be possible to equalize the sensitivities of the main sensitivity axis and the sub-sensitivity axis, it may be possible to cancel out the influence of a disturbance magnetic field and suppress the reduction of current measurement accuracy.

Figure 12A:
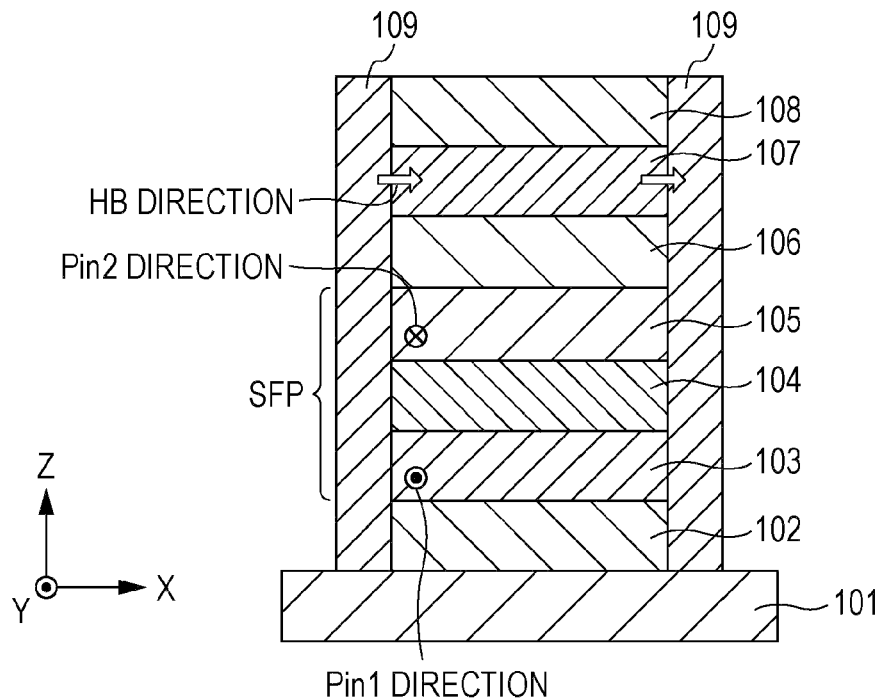
FIGS. 12A and 12B are pattern diagrams illustrating a structure of a GMR element according to a fifth embodiment.
Figure 12B:
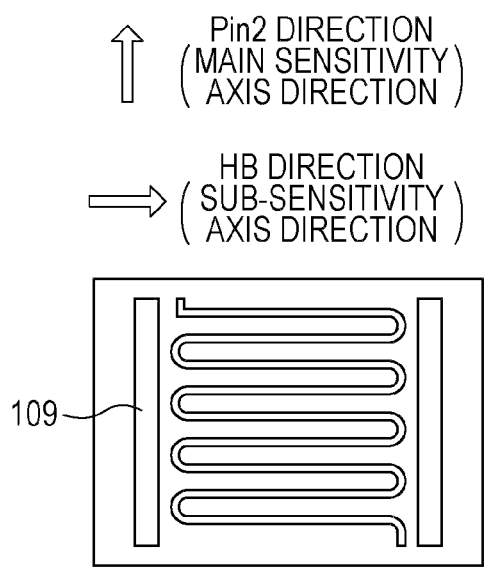

FIGS. 12A and 12B are pattern diagrams illustrating the structure of a GMR element used for the first magnetic sensor 12a and the second magnetic sensor 12b. FIG. 12A illustrates a cross-sectional structure, and FIG. 12B illustrates a planar structure. As illustrated in FIG. 12A, the GMR element is formed so as to have a laminated structure including a plurality of films provided in a substrate 101. In other words, the GMR element includes a seed layer 102, a first ferromagnetic film 103, an antiparallel coupling film 104, a second ferromagnetic film 105, a non-magnetic intermediate layer 106, a soft magnetic free layer (free magnetic layer) 107, and a protective layer 108. In addition, as illustrated in FIG. 12B, the GMR element has a shape (meander shape) where a plurality of belt-like elongated patterns (stripes) are folded that are disposed so that the longitudinal directions thereof become parallel to one another.

In this GMR element, the first ferromagnetic film 103 and the second ferromagnetic film 105 are antiferromagnetically coupled to each other through the antiparallel coupling film 104, and a so-called self-pinned type ferromagnetic fixed layer (synthetic ferri pinned layer: SFP layer) is configured. In this way, the GMR element illustrated in FIGS. 12A and 12B is a spin-valve-type element utilizing the ferromagnetic fixed layer, the non-magnetic intermediate layer 106, and the soft magnetic free layer 107. In addition, while, in FIG. 12A, for ease of explanation, a base layer and the like other than the GMR element are omitted, a base layer may also be provided between the substrate 101 and the seed layer 102, the base layer being configured using a non-magnetic material including at least one of elements such as, for example, Ta, Hf, Nb, Zr, Ti, Mo, and W.

The seed layer 102 is configured using NiFeCr, Cr, or the like. It is desirable that the first ferromagnetic film 103 is configured using a CoFe alloy including Fe of 40 atomic percent to 80 atomic percent. The reason is that the CoFe alloy in this composition range has a large coercive force and it is possible to stably maintain magnetization with respect to an external magnetic field. In addition, in the first ferromagnetic film 103, during the film formation thereof, a magnetic field is applied in a direction (a direction headed from the far side to the near side in FIG. 12A and headed from the upper side to the lower side in FIG. 12B) perpendicular to the longitudinal direction of the meander shape, and hence, induced magnetic anisotropy is assigned. The antiparallel coupling film 104 is configured using Ru or the like. In addition, it is desirable that the second ferromagnetic film 105 is configured using a CoFe alloy including Fe of 0 atomic percent to 40 atomic percent. The reason is that the CoFe alloy in this composition range has a small coercive force and it becomes easy for the CoFe alloy in this composition range to be magnetized in a direction antiparallel to (a direction different by 180 degrees from) a direction in which the first ferromagnetic film 103 is preferentially magnetized. In addition, in the second ferromagnetic film 105, during the film formation thereof, the same magnetic field (a magnetic field in a direction perpendicular to the longitudinal direction of the meander shape) as in the film formation of the first ferromagnetic film 103 is applied, and hence, induced magnetic anisotropy is assigned. By performing the film formation while such a magnetic field is being applied, the first ferromagnetic film 103 is preferentially magnetized in the direction of an applied magnetic field (hereinafter, a Pin1 direction), and the second ferromagnetic film 105 is magnetized in a direction antiparallel to (a direction different by 180 degrees from: hereinafter, a Pin2 direction) the magnetization direction of the first ferromagnetic film 103. The non-magnetic intermediate layer 106 is configured using Cu or the like.

In addition, the soft magnetic free layer (free layer) 107 is configured using a magnetic material such as a CoFe alloy, a NiFe alloy, or a CoFeNi alloy. In addition, it is desirable that, during the film formation of the soft magnetic free layer 107, a magnetic field is applied in the longitudinal direction of the meander shape (a direction perpendicular to the Pin2 direction: an X axis direction) and induced magnetic anisotropy is assigned to the soft magnetic free layer 107 after the film formation. Accordingly, it may be possible to obtain a GMR element whose resistance linearly changes with respect to an external magnetic field in the X axis direction and whose hysteresis is small. The protective layer 108 is configured using Ta, Ru, or the like.

In such a GMR element and a magnetic sensor including the GMR element, a main sensitivity axis direction is the Pin2 direction. In addition, a sub-sensitivity axis direction is a direction perpendicular to the Pin2. A substantial sensitivity is not included in a direction perpendicular to the planar direction of a substrate or a film.

It is desirable that the GMR element includes a hard bias layer 109 and a given magnetic field is applied from the hard bias layer 109 to the soft magnetic free layer (free layer) 107. The direction of the magnetic field (hereinafter, a hard bias (HB)) due to the hard bias layer 109 is the longitudinal direction of the meander shape (a direction perpendicular to the Pin2 direction: the X axis direction). Owing to such a hard bias layer 109, it may be possible to enhance the sensitivity of the GMR element.

In addition, owing to the hard bias layer 109, the main sensitivity axis direction of the GMR element may be controlled so as to be oriented in a direction (the Pin2 direction) perpendicular to the direction of the hard bias and the sub-sensitivity axis direction thereof may be controlled so as to be oriented in the direction (a direction perpendicular to the Pin2) of the hard bias. Therefore, by aligning the direction of the hard bias of the GMR element used for the current sensor, it may be possible to realize a configuration capable of adequately cancelling out the influence of a disturbance magnetic field emerging in the main sensitivity axis direction or the sub-sensitivity axis direction. Accordingly, it may be possible to reduce the influence of a disturbance magnetic field in the sub-sensitivity axis direction and suppress the reduction of current measurement accuracy.

The present embodiment may be arbitrarily combined with a configuration illustrated in another embodiment, and implemented.

As described above, in the current sensor 1 of the present invention, by controlling the sub-sensitivity axis direction in addition to the main sensitivity axis direction, it may become possible to cancel out a disturbance magnetic field, in particular, an induction magnetic field due to an adjacent current. Accordingly, it may be possible to suppress the reduction of current measurement accuracy. In addition, accordingly, it may be possible to achieve the miniaturization of a system including the current sensor and saving of the space thereof.

In addition, the present invention is not limited to the above-mentioned embodiments, and may be implemented with being variously modified. For example, the disposition and the size of each configuration element in the abovementioned embodiments may be implemented with being arbitrarily modified. In addition, the direction of the current to be measured I flowing through the current line 11 may also be oriented in an opposite direction. In addition, the configurations illustrated in the first embodiment to the fifth embodiment may be arbitrarily combined, and implemented. In addition, the present invention may be arbitrarily modified and implemented without departing from the scope of the present invention.

The current sensor of the present invention may be used for, for example, detecting the magnitude of a current used for driving motors in electric vehicles, hybrid vehicles, and the like.

What is claimed is:

1. A current sensor comprising:
a first magnetic sensor and a second magnetic sensor disposed around a current line through which a current to be measured flows, the first and second magnetic sensors detecting an induction magnetic field applied thereto from the current to be measured, the first magnetic sensor having a first main sensitivity axis and a first sub-sensitivity axis perpendicular to the first main sensitivity axis, and the second magnetic sensor having a second main sensitivity axis and a second sub-sensitivity axis perpendicular to the second main sensitivity axis,
wherein the first magnetic sensor and the second magnetic sensor are disposed such that the first main sensitivity axis is oriented in a direction of the induction magnetic field applied to the first magnetic sensor, the second main sensitivity axis is oriented in a direction opposite to a direction of the induction magnetic field applied to the second magnetic sensor, the first and second main sensitivity axes are oriented in a same direction, and both of the first sub-sensitivity axis and the second sub-sensitivity axis are oriented in a respective direction either the same as or opposite to a direction of a sub-sensitivity axis component of an adjacent induction magnetic field applied to the first magnetic sensor and the second magnetic sensor, respectively, from an adjacent current flowing through an adjacent current line adjacent to the current line.

2. The current sensor according to claim 1, further comprising:
an arithmetic device configured to obtain a difference between an output of the first magnetic sensor and an output of the second magnetic sensor.

3. The current sensor according to claim 1, wherein
the first magnetic sensor and the second magnetic sensor are disposed such that the first and second sub-sensitivity axes are oriented in a same direction.

4. The current sensor according to claim 1, wherein
the first magnetic sensor and the second magnetic sensor are disposed such that the first main sensitivity axis is oriented in a direction the same as or opposite to a direction of the adjacent current line, and the second main sensitivity axis is oriented in a direction the same as or opposite to the direction of the adjacent current line.

5. The current sensor according to claim 1, wherein
the first and second main sensitivity axes are oriented in a direction in which the adjacent current line extends.

6. The current sensor according to claim 1, wherein
the first magnetic sensor and the second magnetic sensor are disposed such that both of the first and second main sensitivity axes are oriented in a direction the same as or opposite to a respective direction of a main sensitivity axis component of the adjacent induction magnetic field applied to the first magnetic sensor and the second magnetic sensor, respectively.

7. The current sensor according to claim 1, further comprising:
a circuit substrate on which the first magnetic sensor and the second magnetic sensor are mounted, the circuit substrate being disposed within a plane perpendicular to a direction in which the current line extends.

8. A current sensor comprising:
a first magnetic sensor and a second magnetic sensor disposed around a current line through which a current to be measured flows, the first and second magnetic sensors detecting an induction magnetic field applied thereto from the current to be measured, the first magnetic sensor having a first main sensitivity axis and a first sub-sensitivity axis in a direction perpendicular to the first main sensitivity axis, and the second magnetic sensor having a second main sensitivity axis and a second sub-sensitivity axis perpendicular to the second main sensitivity axis,
wherein the first magnetic sensor and the second magnetic sensor are disposed such that both of the first and second main sensitivity axes are oriented in a direction same as or opposite to a respective direction of the induction magnetic field applied thereto from the current to be measured, directions of the first and second sensitivity axes are opposite to each other, the first sub-sensitivity axis is oriented in a direction of a sub-sensitivity axis component of an adjacent induction magnetic field applied to the first magnetic sensor from an adjacent current flowing through an adjacent current line adjacent to the current line, and the second sub-sensitivity axis is oriented opposite to a direction of a sub-sensitivity axis component the adjacent induction magnetic field applied to the second magnetic sensor from the adjacent current.

9. The current sensor according to claim 8, further comprising:
an arithmetic device configured to obtain a sum of an output of the first magnetic sensor and an output of the second magnetic sensor.

10. The current sensor according to claim 8, wherein
the first magnetic sensor and the second magnetic sensor are disposed such that directions of the first and second sub-sensitivity axes are opposite to each other.

11. The current sensor according to claim 8, wherein
the first magnetic sensor and the second magnetic sensor are disposed such that the first main sensitivity axis is oriented in a direction of a main sensitivity axis component of the adjacent induction field applied to the first magnetic sensor, and the second main sensitivity axis is oriented opposite to a direction of a main sensitivity axis component of the adjacent induction field applied to the second magnetic sensor.

* * * * *